United States Patent
Klein et al.

(10) Patent No.: US 10,340,950 B2
(45) Date of Patent: Jul. 2, 2019

(54) REDUCING THE SEARCH SPACE OF MAXIMUM-LIKELIHOOD DECODING FOR POLAR CODES

(71) Applicant: QUALCOMM Incorporated, San Diego, CA (US)

(72) Inventors: Aaron Klein, Highland Park, NJ (US); Abhinav Sridhar, Branchburg, NJ (US)

(73) Assignee: QUALCOMM Incorporated, San Diego, CA (US)

(*) Notice: Subject to any disclaimer, the term of this patent is extended or adjusted under 35 U.S.C. 154(b) by 33 days.

(21) Appl. No.: 15/682,387

(22) Filed: Aug. 21, 2017

(65) Prior Publication Data

US 2019/0058490 A1    Feb. 21, 2019

(51) Int. Cl.
| | |
|---|---|
| *H04L 1/00* | (2006.01) |
| *H03M 13/11* | (2006.01) |
| *G06F 17/10* | (2006.01) |
| *H03M 13/15* | (2006.01) |

(52) U.S. Cl.
CPC ........ *H03M 13/1125* (2013.01); *H04L 1/0054* (2013.01); *G06F 17/10* (2013.01); *H03M 13/15* (2013.01)

(58) Field of Classification Search
CPC .............. H04L 1/0054; H03M 13/1125
See application file for complete search history.

(56) References Cited

U.S. PATENT DOCUMENTS

| | | | |
|---|---|---|---|
| 2013/0117344 | A1 | 5/2013 | Gross et al. |
| 2014/0019820 | A1 | 1/2014 | Vardy et al. |
| 2014/0173376 | A1 | 6/2014 | Jeong et al. |
| 2014/0208183 | A1 | 7/2014 | Mahdavifar et al. |

(Continued)

FOREIGN PATENT DOCUMENTS

| | | |
|---|---|---|
| CN | 103220001 A | 7/2013 |
| CN | 103368583 A | 10/2013 |

(Continued)

OTHER PUBLICATIONS

Gabi Sarkis, Alexander Vardy, Claude Thibeault, and Warren J. Gross; Fast List Decoders for Polar Codes; IEEE Journal on Selected Areas in Communications, vol. 34, No. 2, Feb. 2016; pp. 318-328 (Year: 2016).*

(Continued)

*Primary Examiner* — Joseph D Torres
(74) *Attorney, Agent, or Firm* — Patterson & Sheridan, LLP

(57) ABSTRACT

Certain aspects of the present disclosure generally relate to techniques for encoding, generally including obtaining a payload, determining a set of internal nodes to distribute one or more non-payload bits to based, at least in part, on a target maximum likelihood (ML) search space size for internal nodes in a polar decoding tree, a search space size of each of the internal nodes, and an available number of the non-payload bits left to distribute, forming an information stream by interleaving the non-payload bits with bits of the payload by, for each internal node in the set of internal nodes, assigning one or more non-payload bits to one or more leaf nodes in a subtree rooted at that internal node in the set of internal nodes, and generating a codeword by encoding the information stream using a Polar code.

30 Claims, 23 Drawing Sheets

(56) References Cited

U.S. PATENT DOCUMENTS

| | | | | |
|---|---|---|---|---|
| 2014/0365842 | A1* | 12/2014 | Li | H03M 13/09 |
| | | | | 714/752 |
| 2015/0026543 | A1* | 1/2015 | Li | H03M 13/13 |
| | | | | 714/776 |
| 2016/0013810 | A1* | 1/2016 | Gross | H03M 13/09 |
| | | | | 714/776 |
| 2016/0079999 | A1 | 3/2016 | Shen et al. | |
| 2017/0230059 | A1* | 8/2017 | Giard | H03M 13/134 |
| 2017/0353267 | A1* | 12/2017 | Kudekar | H04L 1/0045 |

FOREIGN PATENT DOCUMENTS

| | | |
|---|---|---|
| CN | 104038234 A | 9/2014 |
| CN | 104124979 A | 10/2014 |
| KR | 101496182 B1 | 3/2015 |
| WO | WO-2016172940 A1 | 11/2016 |

OTHER PUBLICATIONS

International Search Report and Written Opinion—PCT/US2018/043423—ISA/EPO—dated Oct. 25, 2018.
Sarkis G., et al., "Fast Polar Decoders: Algorithm and Implementation", IEEE Journal on Selected Areas in Communications, IEEE Service Center, Piscataway, US, May 1, 2014, vol. 32, No. 5, XP011546181, ISSN: 0733-8716, DOI: 10.1109/JSAC.2014.140514 [retrieved on Apr. 23, 2014], pp. 946-957.
Sarkis G., et al., "Increasing the Throughput of Polar Decoders", IEEE Communications Letters, IEEE Service Center, Piscataway, NJ, US, Apr. 1, 2013, vol. 17, No. 4, XP011506054, ISSN: 1089-7798, DOI:10.1109/LCOMM.2013.021213.121633, pp. 725-728.

* cited by examiner

1400

1: procedure $[V^d, C^d]$ = REDUCED ML ALGORITHM($N$, $T(d)$, $L_{outer}$)
2:    $x \leftarrow L_{outer}$   ▷Initialize x=outer-code bits remaining.
3:    $d \leftarrow log_2(N)$
4:    while $d > 0$ do
5:       $A = sort$(all nodes v with degree=$d$ in order of increasing $R_v$)
6:       Remove all Rate-0 and Rate-1 nodes from A
7:       for $d < k \leq log_2(N)$ do
8:          $B \leftarrow$ all nodes $v \in A | v \in$ sub-tree rooted at any node in $V^k$
9:          $A \leftarrow A - B$
10:         $k \leftarrow k + 1$
11:       end for
12:       $V^d \leftarrow \phi$
13:       $C^d \leftarrow \phi$
14:       for each node $v \in A$ do
15:          if $0 < R_v \leq R_{min}$ then
16:             $V^d \leftarrow V^d \cup \{v\}$
17:             $C^d \leftarrow C^d \cup \{0\}$
18:          else
19:             if Node $v$ has no Rate-1 children then
20:                 if $2^{I_v - x} \leq T(d)$ then
21:                    $c \leftarrow I_v - log_2(T(d))$
22:                    $x \leftarrow x - c$
23:                    $V^d \leftarrow V^d \cup \{v\}$
24:                    $C^d \leftarrow C^d \cup \{c\}$
25:                 else
26:                    Break
27:                 end if
28:             end if
29:          end if
30:       end for
31:       $d \leftarrow d - 1$
32:    end while
33: end procedure

*FIG. 14*

REDUCING THE SEARCH SPACE OF MAXIMUM-LIKELIHOOD DECODING FOR POLAR CODES

TECHNICAL FIELD

Certain aspects of the present disclosure generally relate to encoding bits of information and, more particularly, to methods and apparatus for reducing the search space of maximum likelihood (ML) decoding for polar codes.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an e NodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, gNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

Additionally, NR is expected to introduce new encoding and decoding schemes that improve transmission and reception of data. For example, Polar codes are currently being considered as a candidate for error-correction in next-generation wireless systems such as NR. Polar codes are a relatively recent breakthrough in coding theory, which have been proven to asymptotically (for code size N approaching infinity) achieve the Shannon capacity. However, while Polar codes perform well at large values of N, for lower values of N, polar codes suffer from poor minimum distance, leading to the development of techniques such as successive cancellation list (SCL) decoding, which leverage a simple outer code having excellent minimum distance, such as a CRC or parity-check, on top of a polar inner code, such that the combined code has excellent minimum distance.

However, as the demand for mobile broadband access continues to increase, there exists a need for further improvements in NR technology, such as improvements in encoding and decoding schemes for NR. Preferably, these improvements should be applicable to other multi-access technologies and the telecommunication standards that employ these technologies.

BRIEF SUMMARY OF SOME EMBODIMENTS

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Certain aspects of the present disclosure provide a method for wireless communications in a network. The method generally includes obtaining a payload to be transmitted, determining, in a polar decoding tree associated with a code size and a coding rate, a set of internal nodes to distribute one or more non-payload bits to based, at least in part, on a target maximum likelihood (ML) search space size for internal nodes in the polar decoding tree, a search space size of each of the internal nodes in the set of internal nodes, and an available number of the non-payload bits left to distribute, forming an information stream by interleaving at least one or more of the non-payload bits with bits of the payload, wherein interleaving comprises, for each internal node in the set of internal nodes, assigning one or more non-payload bits to one or more leaf nodes in a subtree rooted at that internal node in the set of internal nodes, and generating a codeword by encoding the information stream using a Polar code.

Certain aspects of the present disclosure provide an apparatus for wireless communications in a network. The apparatus generally includes at least one processor configured to obtain a payload to be transmitted, determine, in a polar decoding tree associated with a code size and a coding rate, a set of internal nodes to distribute one or more non-payload bits to based, at least in part, on a target maximum likelihood (ML) search space size for internal nodes in the polar decoding tree, a search space size of each of the internal nodes in the set of internal nodes, and an available number of the non-payload bits left to distribute, form an information stream by interleaving at least one or more of the non-payload bits with bits of the payload, wherein interleaving comprises, for each internal node in the set of internal nodes, assigning one or more non-payload bits to one or more leaf nodes in a subtree rooted at that internal node in the set of internal nodes, and generate a codeword by encoding the information stream using a Polar code. The apparatus also generally includes a memory coupled with the at least one processor.

Certain aspects of the present disclosure provide an apparatus for wireless communications in a network. The method generally includes means for obtaining a payload to be transmitted, means for determining, in a polar decoding tree associated with a code size and a coding rate, a set of internal nodes to distribute one or more non-payload bits to based, at least in part, on a target maximum likelihood (ML) search space size for internal nodes in the polar decoding tree, a search space size of each of the internal nodes in the set of internal nodes, and an available number of the non-payload bits left to distribute, means for forming an information stream by interleaving at least one or more of the non-payload bits with bits of the payload, wherein interleaving comprises, for each internal node in the set of internal nodes, assigning one or more non-payload bits to one or more leaf nodes in a subtree rooted at that internal node in the set of internal nodes, and means for generating a codeword by encoding the information stream using a Polar code.

Certain aspects of the present disclosure provide a non-transitory computer-readable medium for wireless communications in a network. The non-transitory computer-readable medium generally includes instructions that, when executed by at least one processor, configure the at least one processor to obtain a payload to be transmitted, determine, in a polar decoding tree associated with a code size and a coding rate, a set of internal nodes to distribute one or more non-payload bits to based, at least in part, on a target maximum likelihood (ML) search space size for internal nodes in the polar decoding tree, a search space size of each of the internal nodes in the set of internal nodes, and an available number of the non-payload bits left to distribute, form an information stream by interleaving at least one or more of the non-payload bits with bits of the payload, wherein interleaving comprises, for each internal node in the set of internal nodes, assigning one or more non-payload bits to one or more leaf nodes in a subtree rooted at that internal node in the set of internal nodes, and generate a codeword by encoding the information stream using a Polar code.

Certain aspects of the present disclosure provide a method for wireless communications in a network. The method generally includes receiving a codeword, determining, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes, and decoding the codeword at least by performing ML decoding on the internal nodes in the set of internal nodes.

Certain aspects of the present disclosure provide an apparatus for wireless communications in a network. The apparatus generally includes at least one processor configured to receive a codeword, determine, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes, and decode the codeword at least by performing ML decoding on the internal nodes in the set of internal nodes. The apparatus also generally includes a memory coupled with the at least one processor.

Certain aspects of the present disclosure provide an apparatus for wireless communications in a network. The method generally includes means for receiving a codeword, means for determining, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes, and means for decoding the codeword at least by performing ML decoding on the internal nodes in the set of internal nodes.

Certain aspects of the present disclosure provide a non-transitory computer-readable medium for wireless communications in a network. The non-transitory computer-readable medium generally includes instructions that, when executed by at least one processor, configure the at least one processor to receive a codeword, determine, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes, and decode the codeword at least by performing ML decoding on the internal nodes in the set of internal nodes.

The techniques may be embodied in methods, apparatuses, and computer program products. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 14 illustrates an example algorithm for determining how to distribute outer-code bits within the leaf nodes of a decoding tree, in accordance with certain aspects of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
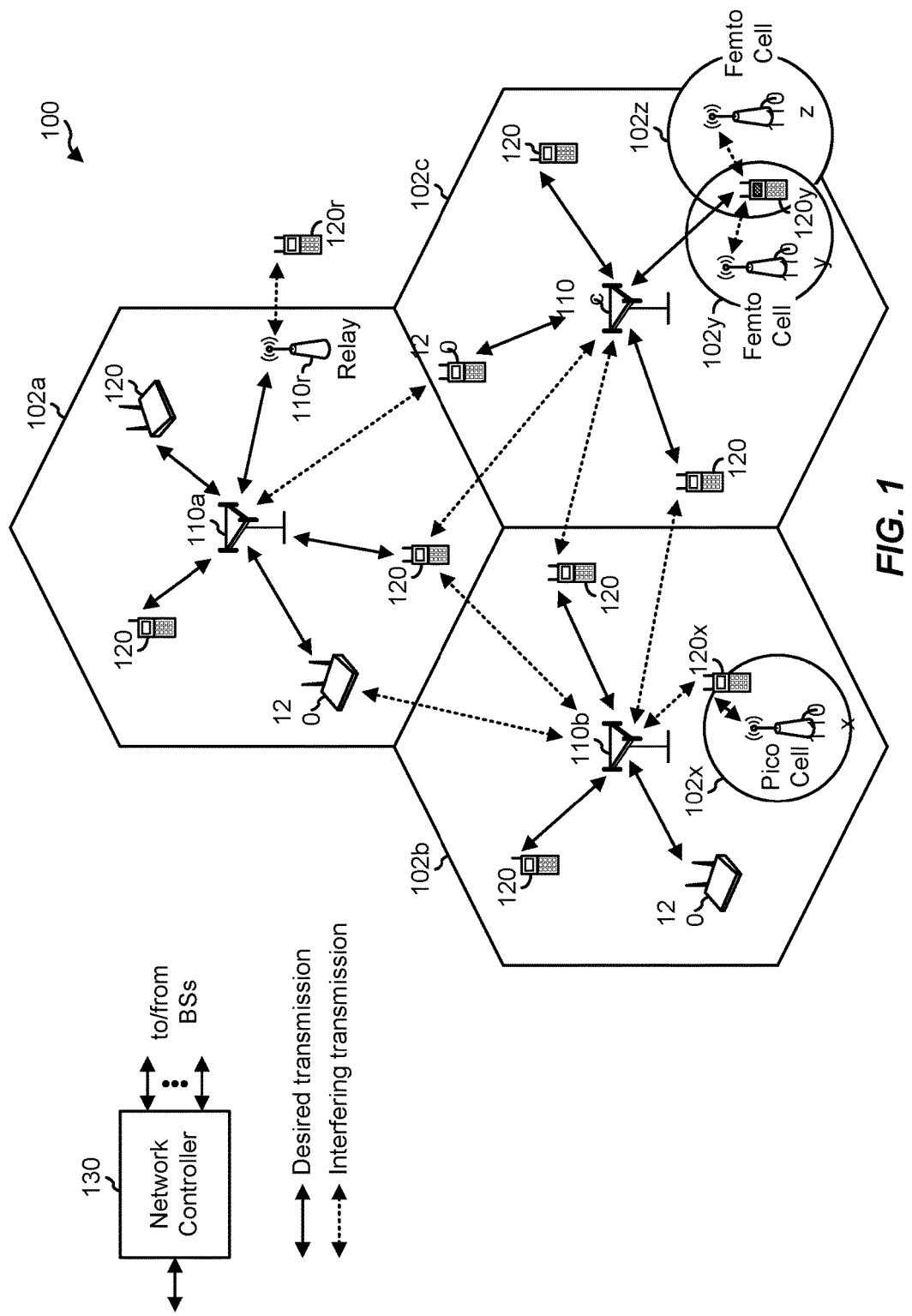
FIG. 1 is a block diagram conceptually illustrating an example telecommunications system, in accordance with certain aspects of the present disclosure.

Aspects of the present disclosure provide apparatus, methods, processing systems, and computer readable mediums for encoding bits of information. Such encoding can be used, for example, for compression or storage, or for transmission in networks, including wireless networks. For example, such encoding may be adopted for new radio (NR) (new radio access technology or 5G technology) wireless communication systems. It should be understood that, while aspects of the present disclosure are proposed in relation to a wireless communication system, the techniques presented herein are not limited to such wireless communication system. For example, the techniques presented herein may equally apply to compression or storage, or to other communication systems such as fiber communication systems, hard-wire copper communication systems, and the like. In other words, the techniques presented herein may be applied to any system using an encoder.

NR may support various wireless communication services, such as Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra reliable low latency communications (URLLC). These services may include latency and reliability requirements. These services may also have different transmission time intervals (TTI) to meet respective quality of service (QoS) requirements. In addition, these services may co-exist in the same subframe.

Aspects of the present disclosure relate to encoding bits of information for transmission, and more particularly, to reducing the search space of maximum likelihood (ML) decoding for polar codes. For example, aspects of the present disclosure propose an encoding technique whereby redundant outer-code bits may be strategically distributed to reduce the size of the search space at certain nodes of a polar decoding tree. According to aspects, reducing the size of the ML search space for certain nodes in the decoding tree may allow the decoder to perform more efficient ML decoding higher up in the decoding tree, thereby reducing decoding latency.

Example Wireless Communications System

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA), time division synchronous CDMA (TD-SCDMA), and other variants of CDMA. cdma2000 covers IS-2000, IS-95 and IS-856 standards. A TDMA network may implement a radio technology such as global system for mobile communications (GSM). An OFDMA network may implement a radio technology such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LTE) and LTE-Advanced (LTE-A), in both frequency division duplex (FDD) and time division duplex (TDD), are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies Additionally, the techniques presented herein may be used in various other non-wireless communication networks, such as fiber network, hard-wire "copper" networks, and the like, or in digital storage or compression. In other words, the techniques presented herein may be used in any system which includes an encoder.

FIG. 1 illustrates an example wireless network 100, such as a new radio (NR) or 5G network, in which aspects of the present disclosure may be performed, for example, for reducing the search space of maximum-likelihood (ML) decoding for polar codes. In some cases, the network 100 may be a fiber network, a hard-wire "copper" network, or the like.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed, employing a multi-slice network architecture.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communications device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR/5G.

NR may utilize OFDM with a CP on the uplink and downlink and include support for half-duplex operation using TDD. A single component carrier bandwidth of 100 MHz may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., gNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
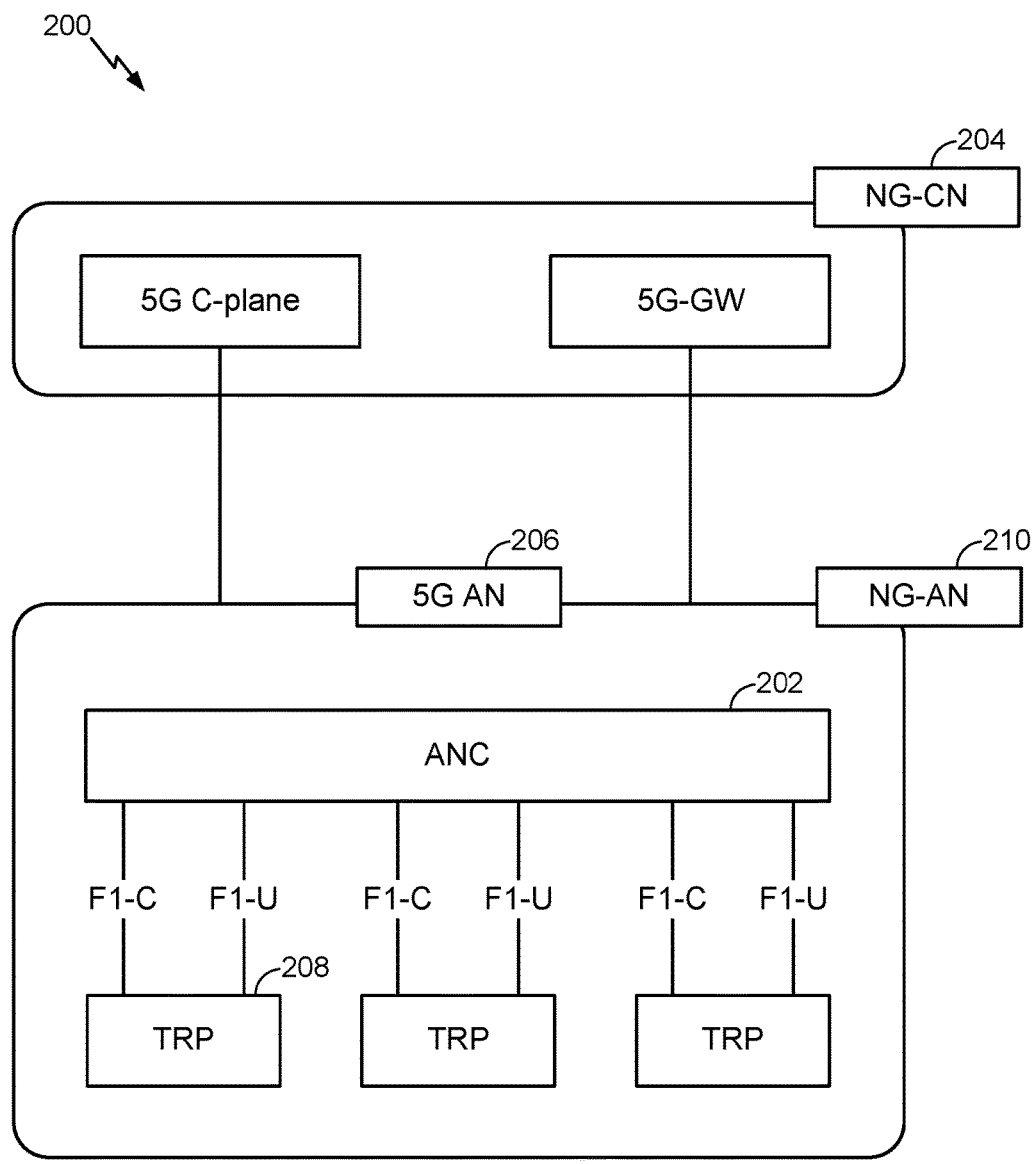
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
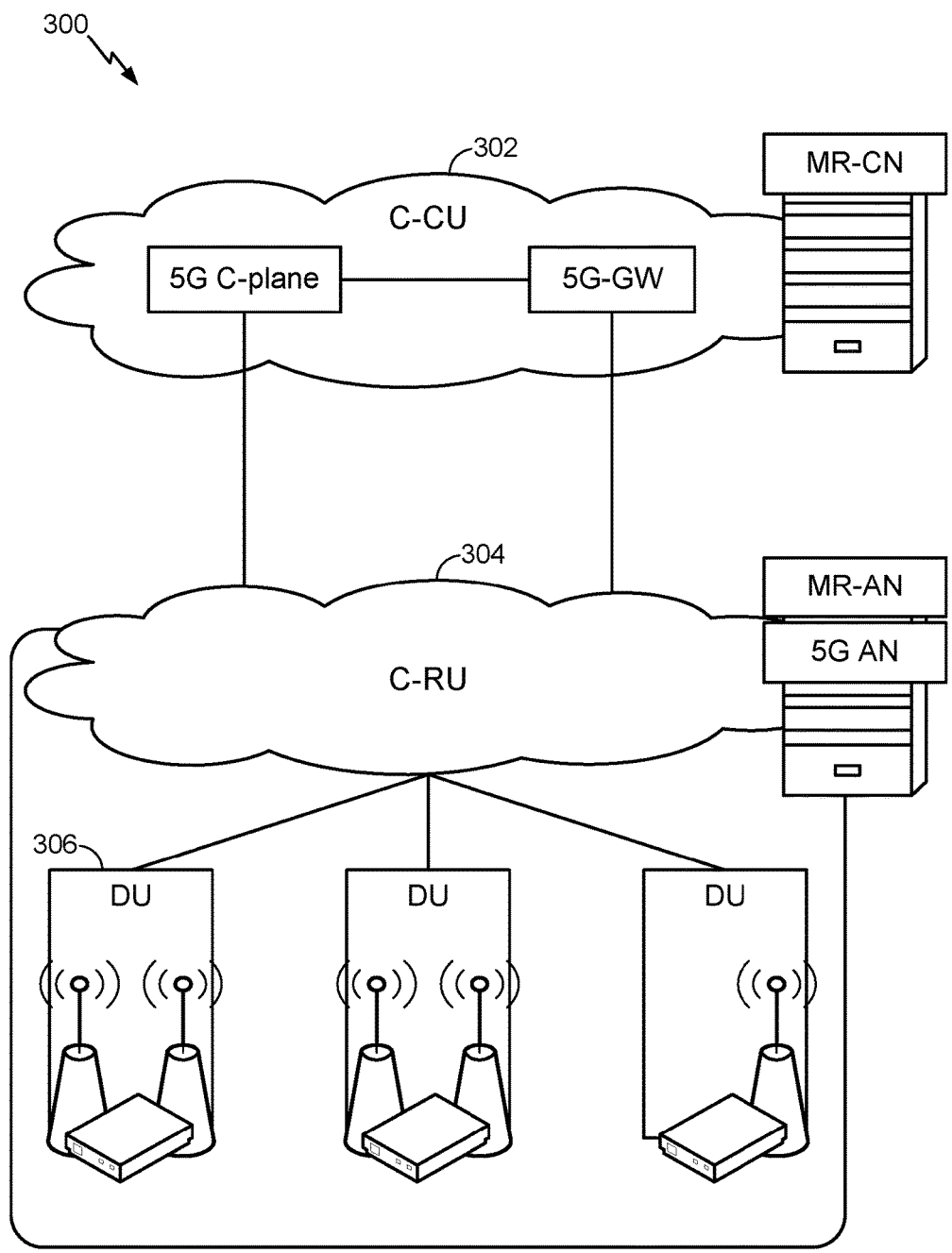
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
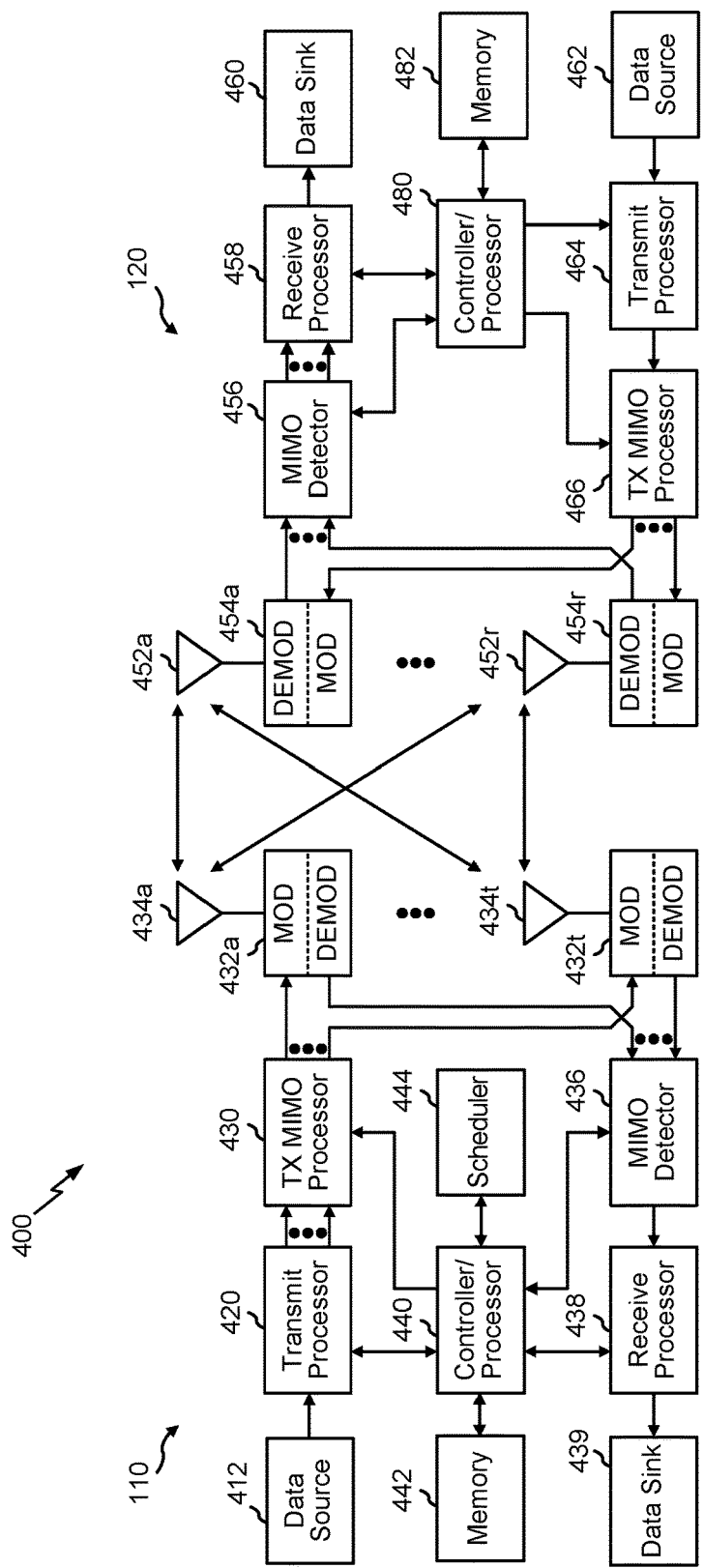
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein and illustrated with reference to FIG. 11.

According to aspects, for a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 6, and/or other processes for the techniques described herein. The processor 480 and/or other processors and modules at the UE 120 may also perform or direct, e.g., the execution of the functional blocks illustrated in FIG. 7, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
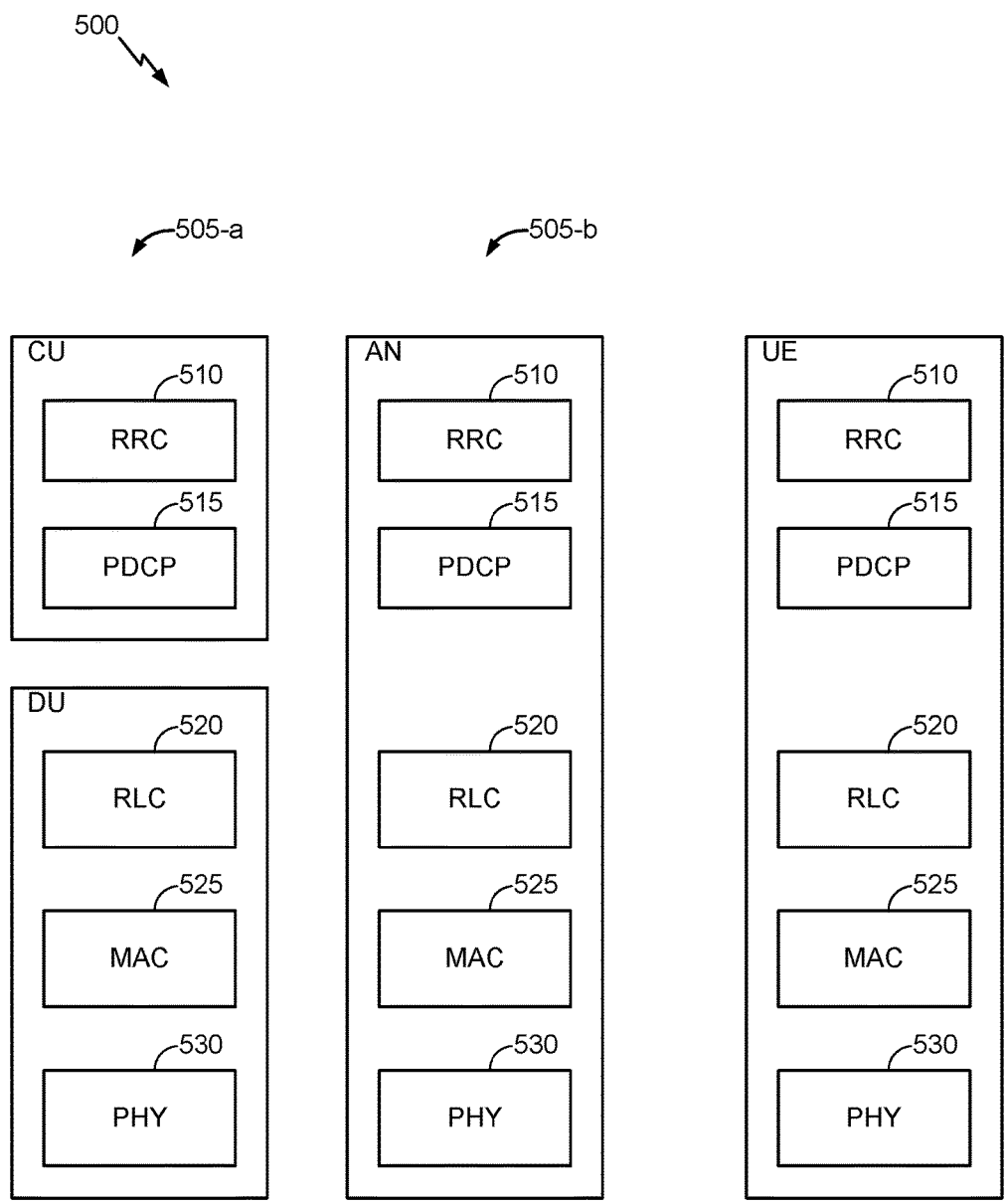
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like.). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack (e.g., the RRC layer 510, the PDCP layer 515, the RLC layer 520, the MAC layer 525, and the PHY layer 530).

Figure 6:
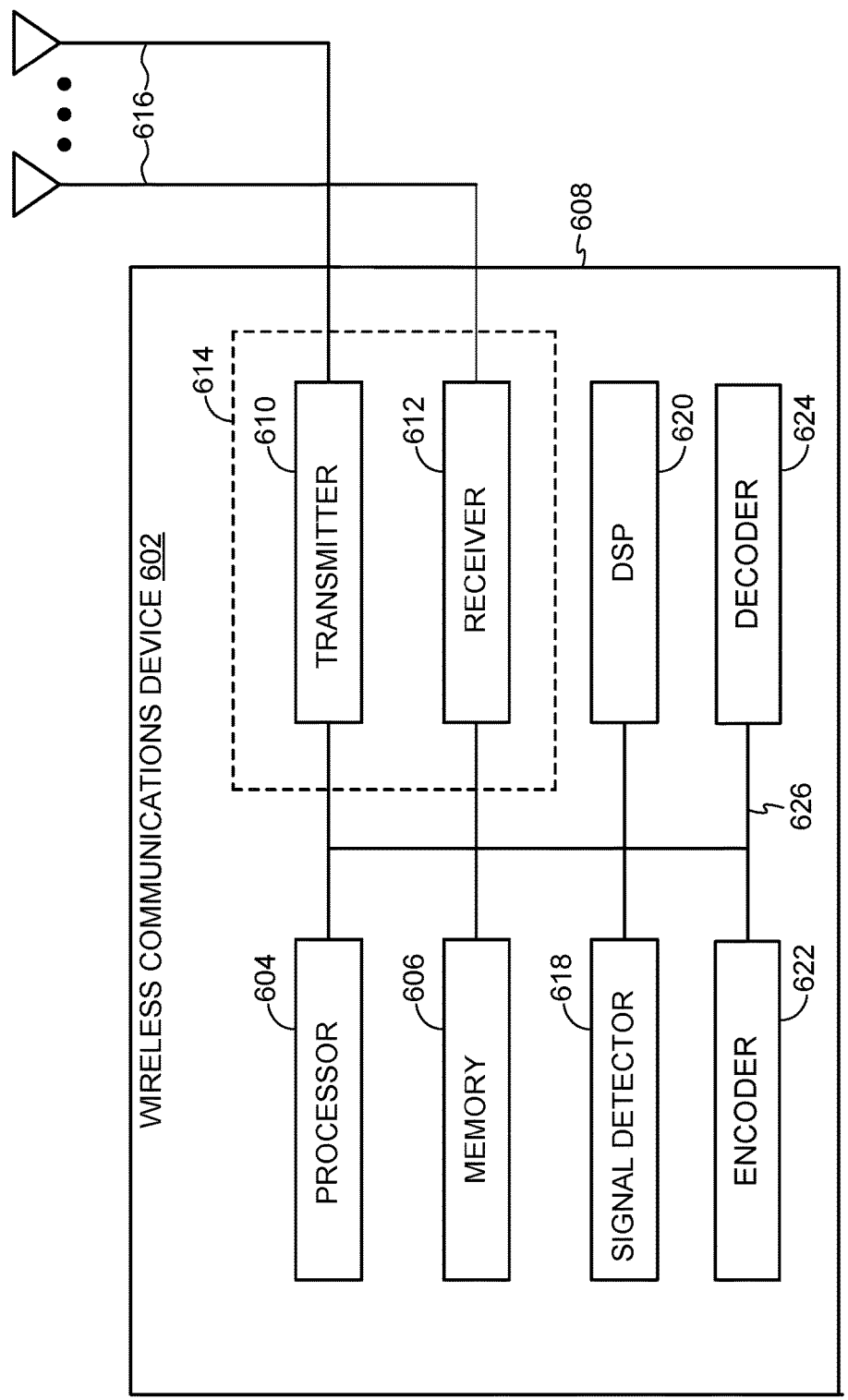
FIG. 6 illustrates a block diagram of an example wireless device in accordance with certain aspects of the present disclosure.

FIG. 6 illustrates various components that may be utilized in a wireless communications device 602 that may be employed within the wireless communication system from FIG. 1. The wireless communications device 602 is an example of a device that may be configured to implement the various methods described herein, for example, for reducing the search space of ML decoding for polar codes. The wireless communications device 602 may be an BS 110 from FIG. 1 or any of user equipments 120.

The wireless communications device 602 may include a processor 604 which controls operation of the wireless communications device 602. The processor 604 may also be referred to as a central processing unit (CPU). Memory 606, which may include both read-only memory (ROM) and random access memory (RAM), provides instructions and data to the processor 604. A portion of the memory 606 may also include non-volatile random access memory (NVRAM). The processor 604 typically performs logical and arithmetic operations based on program instructions stored within the memory 606. The instructions in the memory 606 may be executable to implement the methods described herein.

The wireless communications device 602 may also include a housing 608 that may include a transmitter 610 and a receiver 612 to allow transmission and reception of data between the wireless communications device 602 and a remote location. The transmitter 610 and receiver 612 may be combined into a transceiver 614. A single or a plurality of transmit antennas 616 may be attached to the housing 608 and electrically coupled to the transceiver 614. The wireless communications device 602 may also include (not shown) multiple transmitters, multiple receivers, and multiple transceivers.

The wireless communications device 602 may also include a signal detector 618 that may be used in an effort to detect and quantify the level of signals received by the transceiver 614. The signal detector 618 may detect such signals as total energy, energy per subcarrier per symbol, power spectral density and other signals. The wireless communications device 602 may also include a digital signal processor (DSP) 620 for use in processing signals.

Additionally, the wireless communications device 602 may also include an encoder 622 for use in encoding signals for transmission. For example, in some cases, the encoder 622 may be configured to distribute/assign redundant outer-code bits into nodes of a polar decoding tree, for example, to reduce the search space of ML decoding for polar codes, as described below. In some cases, the encoder 622 may be configured to perform operations presented herein, for example, with reference to FIG. 11A. While encoder 622 is shown as a single encoder, it should be understood that encoder 622 may include one or more encoders (e.g., an outer-code encoder and an inner-code encoder) configured to perform techniques presented herein.

Further, the wireless communications device 602 may include a decoder 624 for use in decoding received signals encoded using techniques presented herein. For example, in some cases, the decoder 624 may be configured to decode a code words determining, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes. In some cases, the decoder 624 may be configured to perform operations presented herein, for example, with reference to FIG. 11B. While decoder 624 is shown as a single decoder, it should be understood that decoder 624 may include one or more decoders (e.g., an outer-code decoder and an inner-code decoder) configured to perform techniques presented herein.

The various components of the wireless communications device 602 may be coupled together by a bus system 626, which may include a power bus, a control signal bus, and a status signal bus in addition to a data bus. The processor 604 may be configured to access instructions stored in the memory 606 to perform connectionless access, in accordance with aspects of the present disclosure discussed below.

Figure 7:
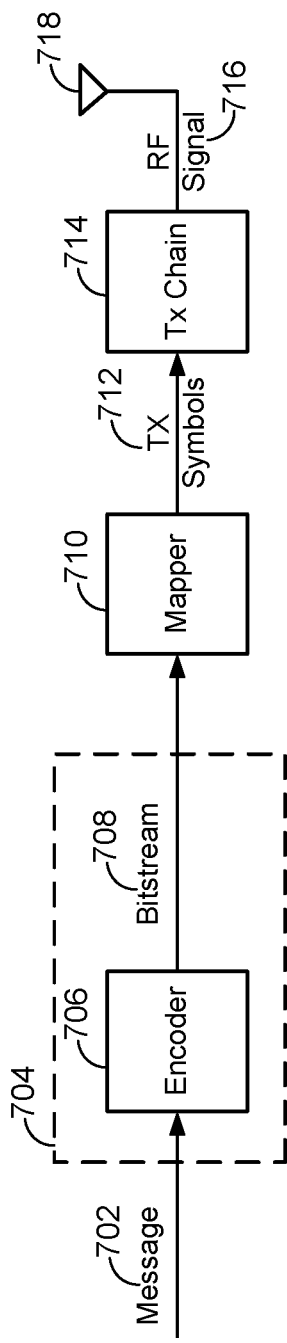
FIG. 7 is a simplified block diagram illustrating a encoder, in accordance with certain aspects of the present disclosure.

FIG. 7 is a simplified block diagram illustrating an encoder, in accordance with certain aspects of the present disclosure. FIG. 7 illustrates a portion of a radio frequency (RF) modem 704 that may be configured to provide an encoded message for wireless transmission (e.g., using polar codes described below). In one example, an encoder 706 (e.g., a polar encoder) in a base station (e.g., BS 110) (or a UE 120 on the reverse path) receives a message 702 for transmission. The message 702 may contain data and/or encoded voice or other content directed to the receiving device. The encoder 706 encodes the message using a suitable modulation and coding scheme (MCS), typically selected based on a configuration defined by the BS 110 or another network entity. In some cases, the encoder 706 may be configured to encode the message 702 using techniques presented herein, for example, with reference to FIG. 11. The encoded bitstream 708 (e.g., representing to the encoded message 702) may then be provided to a mapper 710 that generates a sequence of Tx symbols 712 that are modulated, amplified and otherwise processed by Tx chain 714 to produce an RF signal 716 for transmission through antenna 718.

Figure 8:
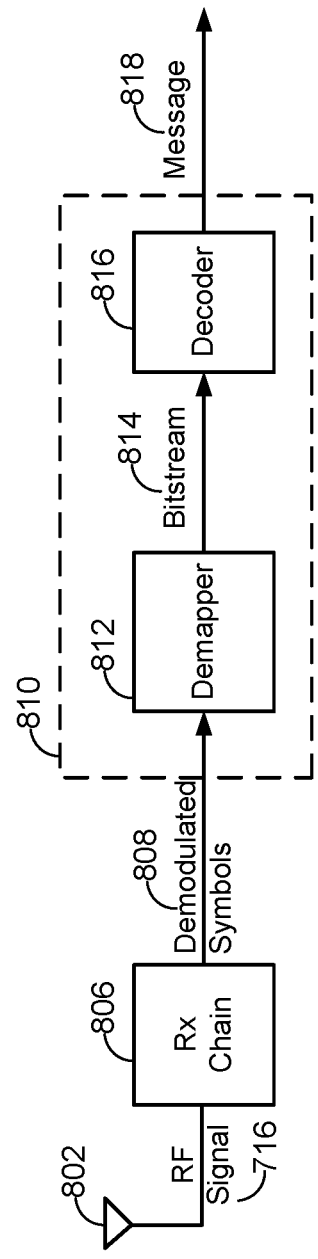
FIG. 8 is a simplified block diagram illustrating a decoder, in accordance with certain aspects of the present disclosure.

FIG. 8 is a simplified block diagram illustrating a decoder, in accordance with certain aspects of the present disclosure. FIG. 8 illustrates a portion of a RF modem 810 that may be configured to receive and decode a wirelessly transmitted signal including an encoded message (e.g., a message encoded using techniques presented herein). In various examples, the modem 810 receiving the signal may reside at the access terminal, at the base station, or at any other suitable apparatus or means for carrying out the described functions. An antenna 802 provides an RF signal 716 (i.e., the RF signal produced in FIG. 4) to an access terminal (e.g., UE 120). An Rx chain 806 processes and demodulates the RF signal 716 and may provide a sequence of symbols 808 to a demapper 812, which produces a sequence of a-priori probabilities 814, often represented as log-likelihood ratios (LLRs) corresponding to the encoded message.

A decoder 816 may then be used to decode m-bit information strings from a bitstream that has been encoded using a coding scheme (e.g., as described herein). The decoder 816 may comprise a polar decoder, an LDPC decoder, a Viterbi decoder, an algebraic decoder, a butterfly decoder, or another suitable decoder. In one example, a Polar decoder employs the successive cancellation (SC) or successive cancellation list (SCL) decoding algorithm. An SC decoding algorithm essentially operates by performing a recursive depth-first traversal of a decoding tree, to convert the bitstream 814 (e.g., a sequence of LLRs) into the message 818 corresponding to the message 702 (e.g., when the decoding is successful).

More specifically, assuming each codeword is of length N, where N must be an integer power of 2 so that $N=2^n$, and that the encoder 706 (e.g., which may be a polar encoder) encodes K information bits into N encoded bits, and rate-matches these to M bits, the LLRs from 814 corresponding to each codeword are first de-ratematched from M bits to N bits by the decoder 816, and a binary tree of depth $n=\log_2(N)$ (e.g., referred to as the decoding tree) is constructed. The root of the tree corresponds to the received vector of N log likelihood ratios (LLRs) to be decoded, and the leaves of the tree correspond to each of the decoded bits, so that N-K of the leaves correspond to the N-K frozen bits (which should decode to the frozen value (zero)), while the remaining K leaves correspond to the K information bits. Let the degree, d, of a node refer to its height above the leaves in the decoding tree, where leaves have d=0 and the root of the tree has $d=\log_2(N)$.

In SC decoding, converting the $2^d$ LLRs corresponding to any node v into the $2^d$ decoded bits corresponding to the $2^d$ leaves of that node (e.g., referred to as decoding node v) is performed via a recursive depth-first traversal of the decoding tree, as follows. For example, the decoder 816 may first use the $2^d$ LLRs corresponding to this node v to calculate the $2^{d-1}$ LLRs corresponding to node v's left child. The decoder 816 may then decode the subcode corresponding to node v's left child. The decoder 816 may then re-encode the length $2^{d-1}$ codeword corresponding to the left child. This partial codeword is referred to as a (left) partial sum. The decoder 816 may then use the partial sum from node v's left child along with the $2^d$ LLRs corresponding to node v to calculate the $2^{d-1}$ LLRs corresponding to v's right child. Thereafter, the decoder 816 may decode the subcode corresponding to node v's right child. Additionally, the decoder 816 may re-encode the length $2^d$ codeword corresponding to the right child and this partial codeword is referred to as a (right) partial sum. Thereafter, the decoder 816 may combine the left and right partial sums to get the partial sum (codeword) corresponding to v.

The above decoding algorithm may be performed recursively starting from the N LLRs at the tree's root node, having degree $d=\log_2(N)$. Applying hard decisions to each (single) LLR at each of the N leaf nodes, after removing the N-K frozen bits, results in the K information bits of the message 818 corresponding to the message 702 (e.g., when the decoding is successful).

In some cases, if an outer code, such as a CRC, were applied before the encoder 706 (e.g., to encode every K' payload bits (e.g., bits of the message 702) into K bits before applying the polar encoder on those K bits to obtain N encoded bits), then an outer code decoder (such as a CRC decoder) would need to be applied to the K information bits output from the decoder 816 to obtain the K' payload bits of the message 818 corresponding to the message 702 (e.g., when the decoding is successful).

Note that in SC decoding, a single bit, corresponding to a single data leaf node, is decoded at a time; the vector of bits that have already been decoded will be referred to as the "decoder history." In SCL decoding, a list of the "best" L paths is maintained, where a path is defined as a decoder history, and the notion of "best" is based off computing a path metric corresponding to a given decoder history. The basic SCL algorithm is similar to SC, and the decoding tree and tree traversal are identical, except that the tree traversal algorithm described for SC above occurs in parallel for all L paths.

In SCL decoding, whenever a data leaf node is encountered, each of the incoming L paths is split into 2 paths, resulting in 2L paths. The first L of those 2L paths are derived by decoding according to the sign of the LLR corresponding to each incoming path, as would be done in SC decoding; these L paths are therefore referred to as SC paths. The remaining L paths are copies of the first L paths, but with the last bit of the decoder history inverted, so that these paths decode according to the inverse of the sign of the LLR corresponding to each incoming path. Therefore, these L paths may be referred to as inverted paths. The path metrics of the L SC paths are unchanged, but the path metrics of the inverted paths are penalized by the magnitude of the corresponding LLR (which has been inverted). The 2L path metrics are then sorted, and the tree traversal resumes with the best L paths. When no outer code is present, message 818 corresponds to the decoded bits corresponding to the path having the best path metric. When an outer code was first applied to the K' payload bits of the message 702 to obtain the K bits input to the encoder 706, an outer code decoder, for example a CRC decoder, may be applied to the decoded bits of each of the L paths, and message 818 is the set of decoded bits which satisfy the outer code decoder (for example, the vector of decoded bits that pass the CRC check).

Figure 9:
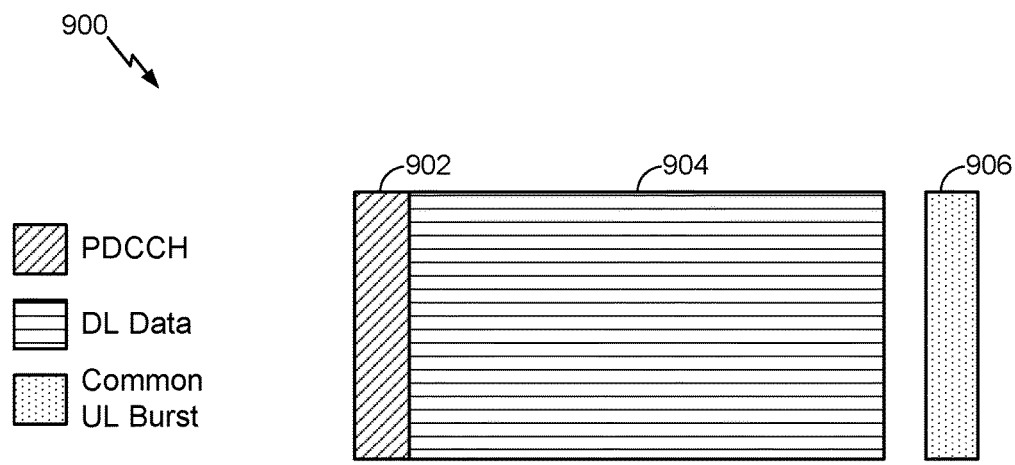
FIG. 9 illustrates an example of a DL-centric subframe, in accordance with certain aspects of the present disclosure.

FIG. 9 is a diagram 900 showing an example of a DL-centric subframe, which may be used by one or more devices (e.g., BS 110 and/or UE 120) to communicate in the wireless network 100. The DL-centric subframe may include a control portion 902. The control portion 902 may exist in the initial or beginning portion of the DL-centric subframe. The control portion 902 may include various scheduling information and/or control information corresponding to various portions of the DL-centric subframe. In some configurations, the control portion 902 may be a physical DL control channel (PDCCH), as indicated in FIG. 9. The DL-centric subframe may also include a DL data portion 904. The DL data portion 904 may sometimes be referred to as the payload of the DL-centric subframe. The DL data portion 904 may include the communication resources utilized to communicate DL data from the scheduling entity (e.g., UE or BS) to the subordinate entity (e.g., UE). In some configurations, the DL data portion 904 may be a physical DL shared channel (PDSCH).

The DL-centric subframe may also include a common UL portion 906. The common UL portion 906 may sometimes be referred to as an UL burst, a common UL burst, and/or various other suitable terms. The common UL portion 906 may include feedback information corresponding to various other portions of the DL-centric subframe. For example, the common UL portion 906 may include feedback information corresponding to the control portion 902. Non-limiting examples of feedback information may include an ACK signal, a NACK signal, a HARQ indicator, and/or various other suitable types of information. The common UL portion 906 may include additional or alternative information, such as information pertaining to random access channel (RACH) procedures, scheduling requests (SRs), and various other suitable types of information. As illustrated in FIG. 9, the end of the DL data portion 904 may be separated in time from the beginning of the common UL portion 906. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 10:
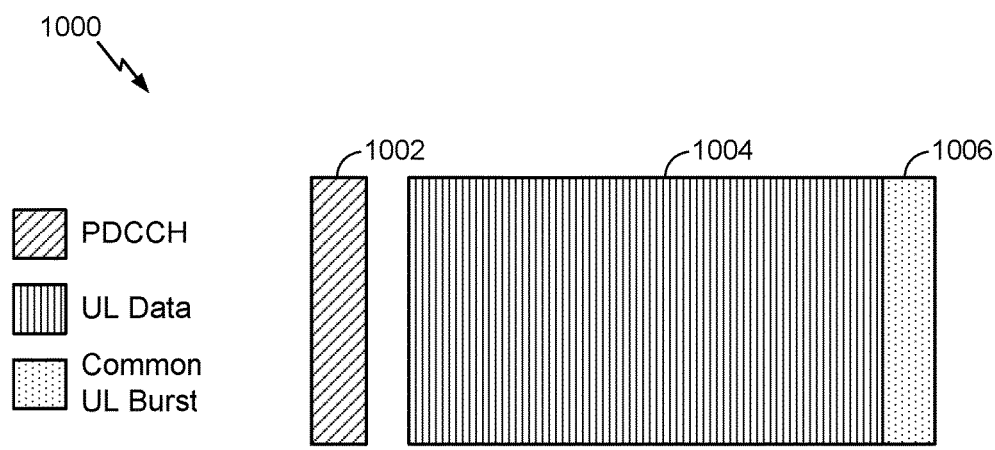
FIG. 10 illustrates an example of an UL-centric subframe, in accordance with certain aspects of the present disclosure.

FIG. 10 is a diagram 1000 showing an example of an UL-centric subframe, which may be used by one or more devices (e.g., BS 110 and/or UE 120) to communicate in the wireless network 100. The UL-centric subframe may include a control portion 1002. The control portion 1002 may exist in the initial or beginning portion of the UL-centric subframe. The control portion 1002 in FIG. 10 may be similar to the control portion described above with reference to FIG. 9. The UL-centric subframe may also include an UL data portion 1004. The UL data portion 1004 may sometimes be referred to as the payload of the UL-centric subframe. The UL portion may refer to the communication resources utilized to communicate UL data from the subordinate entity (e.g., UE) to the scheduling entity (e.g., UE or BS). In some configurations, the control portion 1002 may be a physical DL control channel (PDCCH).

As illustrated in FIG. 10, the end of the control portion 1002 may be separated in time from the beginning of the UL data portion 1004. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 1006. The common UL portion 1006 in FIG. 10 may be similar to the common UL portion 1006 described above with reference to FIG. 10. The common UL portion 1006 may additional or alternative include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Polar Codes

Polar codes are a relatively recent breakthrough in coding theory which have been proven to asymptotically (for code size N approaching infinity) achieve the Shannon capacity. Polar codes have many desirable properties such as deterministic construction (e.g., based on a fast Hadamard transform), very low and predictable error floors, and simple successive-cancellation (SC) based decoding. They are currently being considered as a candidate for error-correction in next-generation wireless systems such as NR.

Polar codes are linear block codes of length $N=2^n$ where their generator matrix is constructed using the $n^{th}$ Kronecker power of the matrix $G = \begin{pmatrix} 1 & 0 \\ 1 & 1 \end{pmatrix}$, denoted by $G^n$. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \qquad \text{Eq. 1}$$

According to certain aspects, a codeword may be generated (e.g., by encoder 706) by using the generator matrix to encode a number of input bits consisting of K information bits and N-K "frozen" bits which contain no information and are "frozen" to a known value, such as zero. For example, given a number of input bits u=(u0, u1, . . . , uN−1), a resulting codeword vector x=(x0, x1, . . . , xN−1) may be generated by encoding the input bits using the generator matrix G. This resulting codeword may then be rate matched and transmitted by a base station over a wireless medium and received by a UE.

When the received vectors are decoded, for example by using a Successive Cancellation (SC) decoder (e.g., decoder 816), every estimated bit, $\hat{u}_i$, has a predetermined error probability given that bits u0i−1 were correctly decoded, that, for extremely large codesize N, tends towards either 0 or 0.5. Moreover, the proportion of estimated bits with a low error probability tends towards the capacity of the underlying channel. Polar codes exploit this phenomenon, called channel polarization, by using the most reliable K bits to transmit information, while setting to a predetermined value (such as 0), also referred to as freezing, the remaining (N−K) bits, for example as explained below.

Polar codes transform the channel into N parallel "virtual" channels for the N information and frozen bits. If C is the capacity of the channel, then, for sufficiently large values of N, there are almost N*C channels which are extremely reliable and there are almost N(1−C) channels which are extremely unreliable. The basic polar coding scheme then involves freezing (i.e., setting to a known value, such as zero) the input bits in u corresponding to the unreliable channels, while placing information bits only in the bits of u corresponding to reliable channels. For short-to-medium N, this polarization may not be complete in the sense there could be several channels which are neither completely unreliable nor completely reliable (i.e., channels that are marginally reliable). Depending on the rate of transmission, bits corresponding to these marginally reliable channels may be either frozen or used for information bits.

Example Reducing the Search Space of ML-Decoding for Polar Codes

As noted above, polar codes are a relatively recent breakthrough in coding theory and have been proven to achieve Shannon capacity for large values of a codeblock size N. For lower values of N, polar codes suffer from poor minimum distance, leading to the development of techniques such as successive cancellation list (SCL) decoding, which leverage a simple outer code having excellent minimum distance, such as a CRC or parity-check, on top of a polar inner code, such that the combined code has excellent minimum distance.

Although the addition of the outer code improves the error-rate performance at low values of N, SCL still suffers from relatively poor decoder latency due the decoder having to decode each bit in a serialized fashion using a depth-first tree-traversal (e.g., where this tree may be referred to as a decoder tree or a decoding tree). There have been various suggestions in the literature for doing multi-bit or symbol-based decoding, where an exhaustive maximum-likelihood (ML) search is used at some non-leaf, also referred to as internal, decoding tree nodes to decode several bits at once (these nodes will henceforth be referred to as ML-nodes). Let the degree, d, of a node refer to its height in the tree above the leaves, with leaves having degree d=0. Unfortunately, the complexity and latency of the ML search increases with the size of the search space, which grows as $2^{2^d}$. As this becomes completely infeasible for even relatively low values of d, the options are either to incur large area penalties to be able to handle a large parallel search space, or to only do ML at very low-degree nodes, thus increasing the decoder latency.

Thus, aspects of the present disclosure propose techniques for reducing decoding latency associated with polar codes. For example, in some cases, decoding latency may be reduced by distributing the redundant bits of the outer code into some of the internal nodes such that the size of their ML search spaces can be reduced to a value easily supported by hardware, thus reducing area, while maximizing the degree and quantity of ML-nodes, thus reducing decoding latency.

Figure 11A:
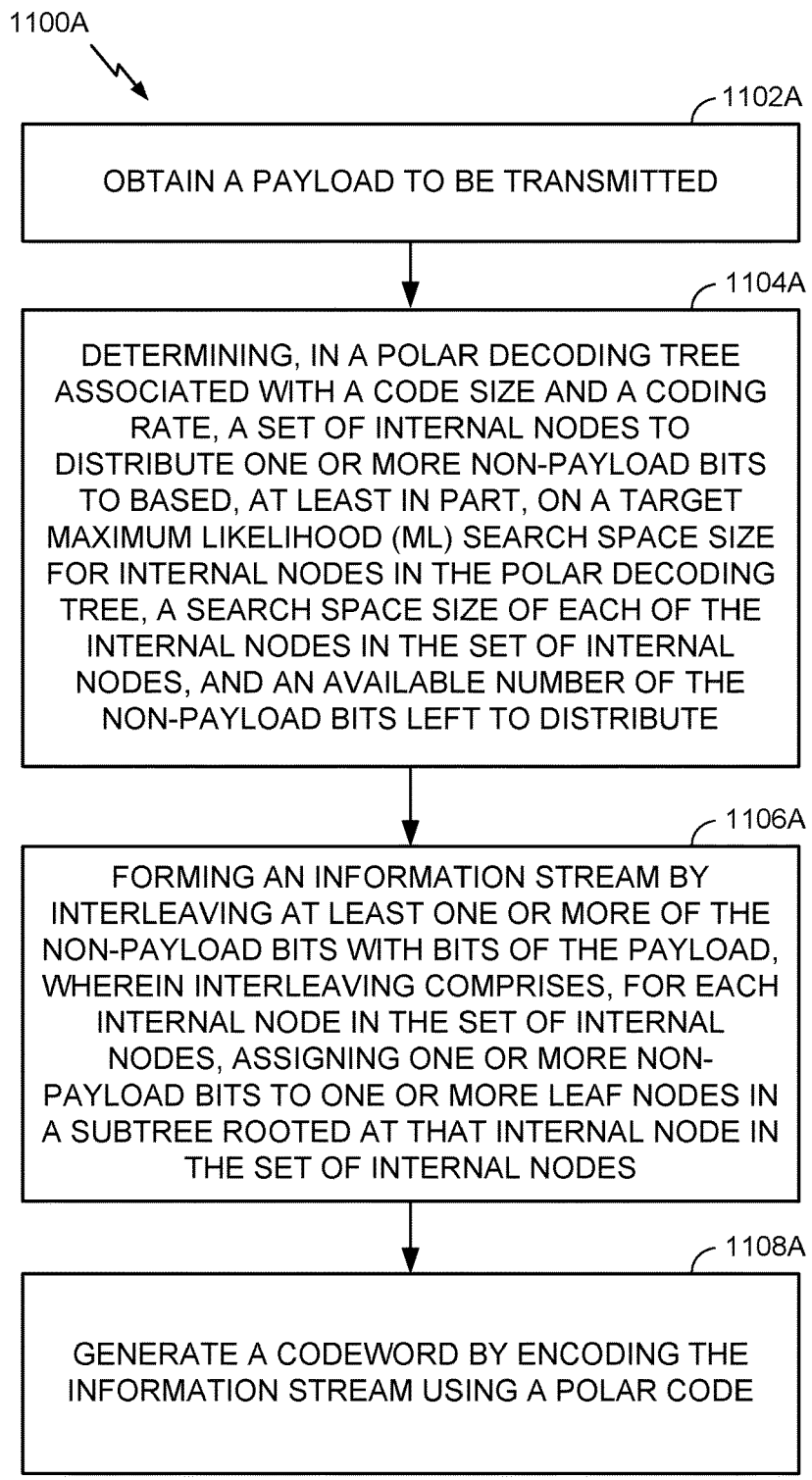
FIG. 11A illustrates example operations for encoding bits of information, in accordance with certain aspects of the present disclosure.

FIG. 11A illustrates example operations for encoding bits of information, for example, for improving decoding latency of polar codes, in accordance with certain aspects of the present disclosure. According to certain aspects, operations 1100A may, for example, be performed by any suitable encoding device, such as a base station (e.g., 110), user equipment (e.g., UE 120), and/or wireless communications device 602.

The encoding device may include one or more components as illustrated in FIGS. 4 and 6 which may be configured to perform the operations described herein. For example, the antenna 434, modulator/demodulator 432, transmit processor 420, controller/processor 440, and/or memory 442 of the base station 110, as illustrated in FIG. 4, may perform the operations described herein. Additionally or alternatively, the antenna 452, demodulator/modulator 454, transmit processor 464, controller/processor 480, and/or memory 482 of the user equipment 120, as illustrated in FIG. 4, may perform the operations described herein. Additionally or alternatively, one or more of the processor 604, memory 606, transceiver 614, DSP 320, encoder 622, decoder 620, and/or antenna(s) 616 as illustrated in FIG. 6 may be configured to perform the operations described herein.

Operations 1100A begin at 1102A by obtaining a payload to be transmitted. At 1104A the encoding device determines, in a polar decoding tree associated with a code size and a coding rate, a set of internal nodes to distribute one or more non-payload bits to based, at least in part, on a target maximum likelihood (ML) search space size for internal nodes in the polar decoding tree, a search space size of each of the internal nodes in the set of internal nodes, and an available number of the non-payload bits left to distribute. At 1106A, the encoding device forms an information stream by interleaving at least one or more of the non-payload bits with bits of the payload, wherein interleaving comprises, for each internal node in the set of internal nodes, assigning one or more non-payload bits to one or more leaf nodes in a subtree rooted at that internal node in the set of internal nodes. At 1108A, the encoding device generates a codeword by encoding the information stream using a Polar code. While not illustrated, operations 1100A may also include transmitting the codeword.

Figure 11B:
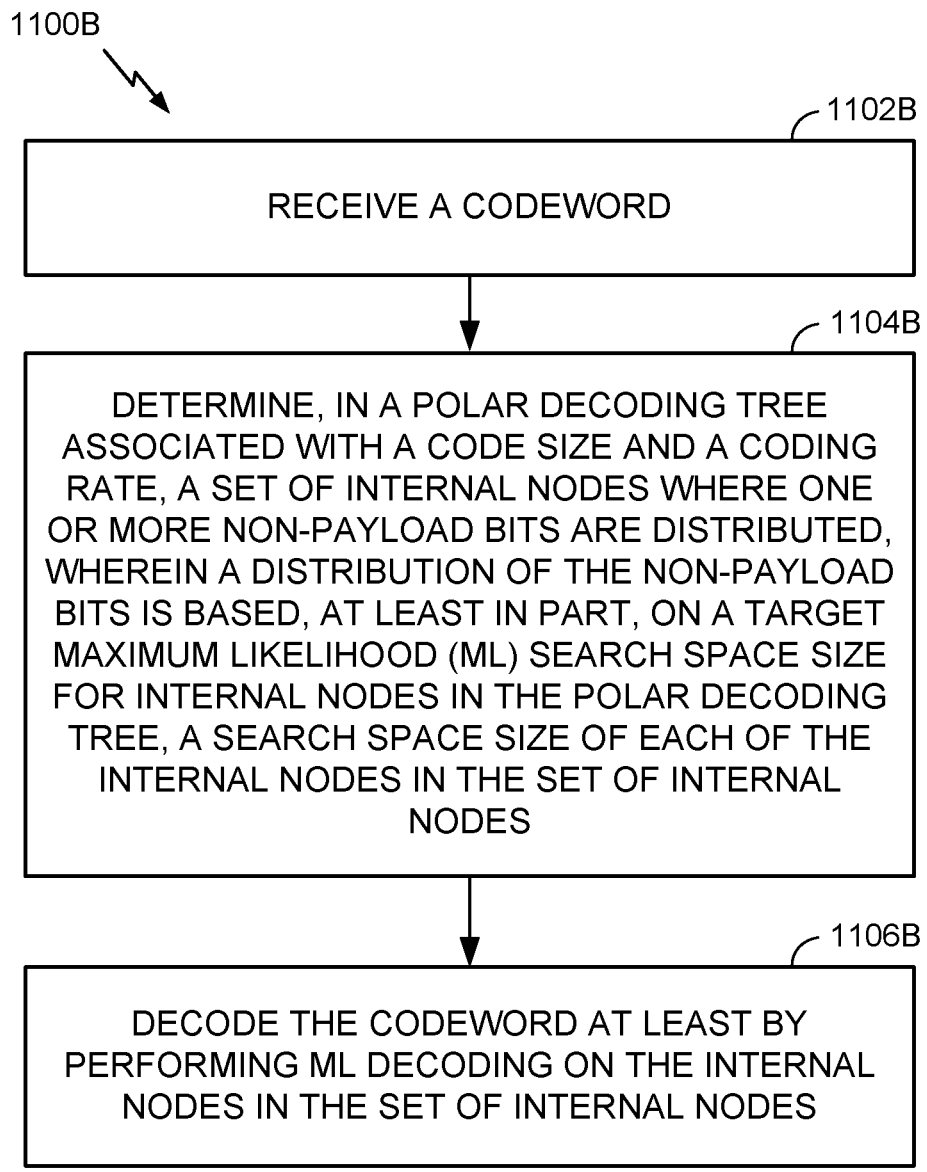
FIG. 11B illustrates example operations for decoding bits of information, in accordance with certain aspects of the present disclosure.

FIG. 11B illustrates example operations for decoding bits of information, in accordance with certain aspects of the present disclosure. According to certain aspects, operations 1100B may, for example, be performed by any suitable decoding device, such as a base station (e.g., 110), user equipment (e.g., UE 120), and/or wireless communications device 602.

The decoding device may include one or more components as illustrated in FIGS. 4 and 6 which may be configured to perform the operations described herein. For example, the antenna 434, modulator/demodulator 432, transmit processor 420, controller/processor 440, and/or memory 442 of the base station 110, as illustrated in FIG. 4, may perform the operations described herein. Additionally or alternatively, the antenna 452, demodulator/modulator 454, transmit processor 464, controller/processor 480, and/or memory 482 of the user equipment 120, as illustrated in FIG. 4, may perform the operations described herein. Additionally or alternatively, one or more of the processor 604, memory 606, transceiver 614, DSP 320, encoder 622, decoder 620, and/or antenna(s) 616 as illustrated in FIG. 6 may be configured to perform the operations described herein.

Operations 1100B begin at 1102B by receiving a codeword. At 1104B, the decoding device determines, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes. At 1106B, the decoding device decodes the codeword at least by performing ML decoding on the internal nodes in the set of internal nodes.

Figure 12A:
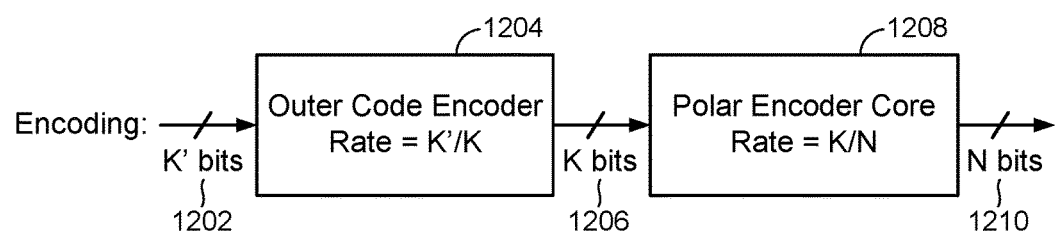
FIGS. 12A-12B illustrate example encoding and decoding processes, in accordance with certain aspects of the present disclosure.
Figure 12B:
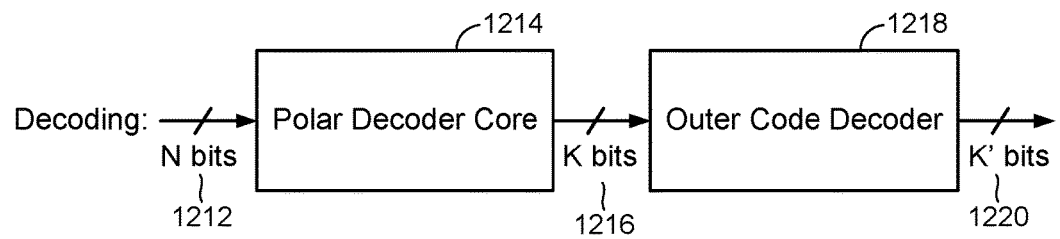

FIGS. 12A-12B illustrate an example encoding and decoding process, according to aspects of the present disclosure. The encoding process and decoding process illustrated in FIGS. 12A-12B may be performed by one or more encoders and decoders, respectively, such as the encoder 706 and/or decoder 816 illustrated in FIGS. 7 and 8.

As illustrated, the encoding process begins with obtaining a payload (e.g., data) 1202, comprising K' bits, for transmission. The payload may then be processed using an outer-code encoder 1204 to generate an information stream 1206, comprising K bits, to be input into a Polar encoder 1208. According to aspects, the information stream 1206 may include the K' bits of the payload and a number of outer-code bits, Louter, generated as a result of processing the payload through the outer-code encoder 1204. As noted, the information stream 1206 (K bits, including the K' payload bits and Louter outer-code bits) may then be input into the Polar encoder 1208 and encoded using a Polar code (e.g., as described above), where N–K frozen bits are added, and Gn is applied to generate a codeword 1210, comprising N bits, for transmission.

On the receiving end, due to interference in a transmission channel used to transmit the codeword 1210, the polar decoder 1214 may receive an input 1212 with N values corresponding to the N bits of the codeword 1210. The input 1212 may then be decoded by the polar decoder 1214 to obtain an estimated information stream 1216 of the information stream 1206. The estimated information stream 1216 may then be decoded using an outer-code decoder 1218 to recover an estimated payload 1220 of the payload 1202, comprising the K' bits.

As noted above, in some cases, decoding latency at the Polar decoder 1214 may be reduced by distributing redundant outer-code bits into ML-nodes of a decoding tree (e.g., as used at the Polar decoder 1214) such that the search space of these ML-nodes may be reduced at the decoder. Thus, aspects of the present disclosure propose an algorithm to be used by an outer-code encoder (e.g., outer-code encoder 1204) such that some subset of the Louter outer-code bits may be strategically placed in specific locations of the input to the polar encoder 1208, such that the degree and quantity of ML-nodes in the polar decoder 1214 is maximized, while the size of the ML search spaces of the ML nodes in polar decoder 1214 is minimized. Aspects of the present disclosure will now describe that algorithm.

According to aspects, the algorithm for reducing the search space of nodes in a decoding tree at a decoder may take several variables as inputs. For example, let K' be the number of bits of a payload desired to be transmitted. Further let K be the number of bits of the information stream generated after processing the payload through an outer-code encoder, where the size of K is greater than the size of K' and includes K' payload bits and Louter outer-code bits (i.e., Louter=K–K'). Additionally, let N=2n, where n is a positive integer, be the total size of the polar code after encoding the information stream (e.g., which includes the outer-code bits and payload bits) and N–K frozen bits. Additionally, let C denote the distribution of these Louter outer-code bits among the K "data" bits of the polar code.

Figure 13:
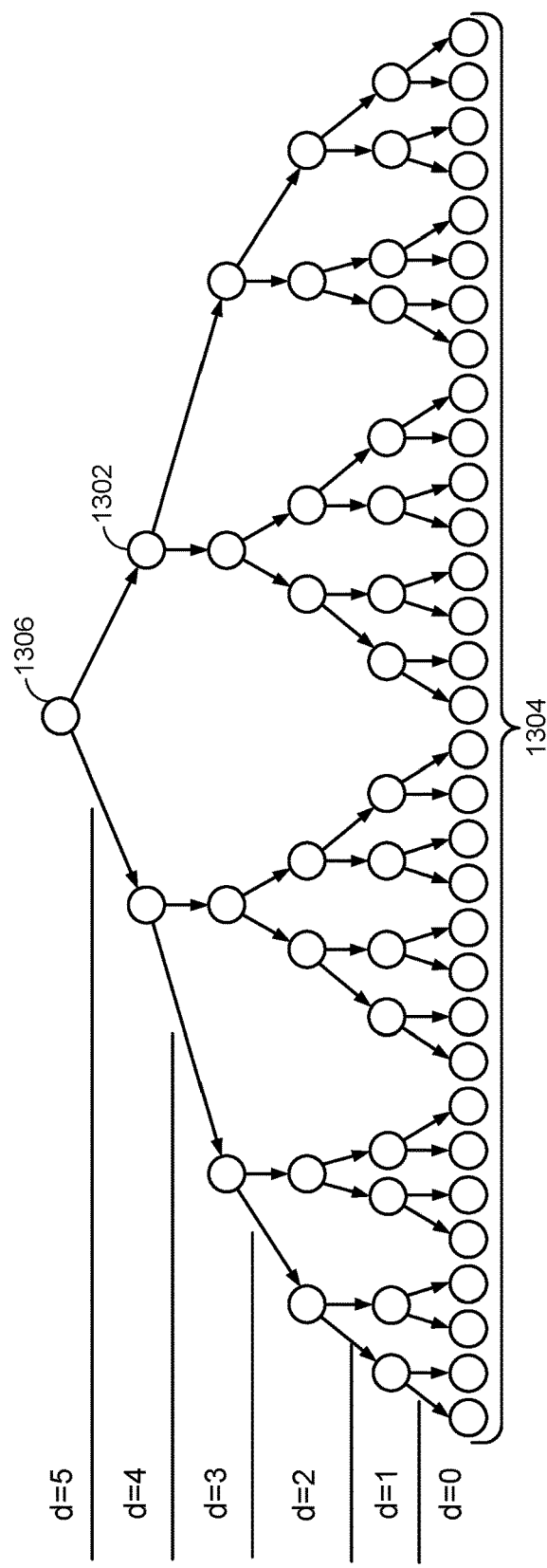
FIG. 13 illustrates an example decoding tree, in accordance with certain aspects of the present disclosure.

According to aspects, a standard SC or SCL decoding algorithm would construct a decoding tree having depth log 2(N), for example, as illustrated in FIG. 13, and runs recursive depth-first successive cancellation algorithms while maintaining the L best paths and associated decoded bits. At the completion of the tree traversal, the best path out of the surviving L paths which also satisfies the outer code would be selected. The latency required to decode a degree-d subcode in such an SCL algorithm may be denoted as td.

Consider a particular node v (e.g., at 1302) in the SCL decoding tree illustrated in FIG. 13. The degree, d, of node v refers to its height in the decoding tree above the leaves (e.g., at 1304), with leaves of the tree having a degree d=0 and the root (e.g., at 1306) of the tree having a degree d=log 2(N). Thus, for example, all degree-5 nodes, such as illustrated in FIG. 13, have exactly 32 leaves, and correspond to a length-32 polar subcode. The non-leaf nodes are also referred to as internal nodes in the tree.

According to aspects, the number of polar information bits (including payload bits and outer code bits) in a subcode corresponding to node v may be denoted as Iv, implying that the effective rate, Rv, of any node v is given by $R_v = I_v/2^d$.

Further, assuming that node v is neither rate-zero nor rate-one, the number of polar information bits associated with node v may be greater than zero but less than 2d. In general, the size of the ML search space for a given node v is at most 2IvL, or 2Iv for each of the L elements in the decoding list. As noted, however, aspects of the present disclosure propose techniques to reduce this search space substantially. This reduced search space size per list element may be denoted as Mv≤2Iv.

Further, T(d) may be denoted as the maximum/threshold ML search-space size that can be supported, per path, for each of the L paths in the SCL list, as a function of the degree d, subject to a given set of hardware constraints (e.g., an area constraint limiting the number of parallel additions, along with a constraint on the allowed latency for doing the ML search). That is T(d) may denote the threshold ML search space size over which ML may not be supported due to hardware constraints. According to aspects, without loss of generality, in some cases, T(d) may be assumed to be an exact integer power of 2 and set low enough for a given hardware dimensioning such that the latency incurred by doing ML at a node v, having per-list-element search-space size of T(d), is less than that of doing SCL at the same node v. For a given search space size per list element, computing node metrics for ML (e.g., to find the best candidates in the search space) may involve on the order of MvL parallel additions of 2d log likelihood ratios (LLRs). Therefore, T(d) may be expected to be inversely proportional to 2d, as the number of LLR additions required to compute node metrics for a given candidate for a given degree d in the decoding tree increases in proportion to 2d. Though aspects of the present disclosure define T(d) to be arbitrary for the purpose of generality, T(d) may typically be set, for example, inversely proportional to 2d in practice. Alternatively, for simplicity, T(d) may simply be made constant, independent of d.

According to aspects, the above definition of T(d) may imply that any node v having 2Iv≤T(d), or Iv≤log 2(T(d)), may be an ML-node capable of more-efficient and less time-consuming decoding. Therefore, without applying the algorithm proposed herein, the maximum rate at which a node v at degree d can be considered as an ML-node (e.g., without applying the algorithm presented herein) may be denoted $R_{min}(d) = \log_2 T(d)/2^d$. According to aspects, Rmin may be the minimum rate above which the algorithm presented herein may begin distributing a non-zero number of outer-code bits to a corresponding node v.

According to aspects, by strategically distributing, or inserting, outer code bits into different locations within the information stream 1206 input into the polar encoder 1208, the search space size of certain nodes in the decoding tree at the polar decoder 1214 may be reduced, thereby increasing the set of nodes where ML may be performed. According to aspects, this increased set of nodes at degree d, for which ML may be performed as opposed to SCL, may be denoted as Vd such that Vd is the set of nodes v at degree d having $0 < Mv \leq T(d)$. According to aspects, any nodes in the set Vd may be referred to as ML nodes.

Therefore, to minimize the latency incurred from tree traversal during decoding of a codeword, the goal of the algorithm is to sequentially maximize |Vd| for each degree d starting from the root (e.g., $d = \log 2(N)$) of the decoding tree. As noted above, any node v having a rate $Rv \leq Rmin$ may be considered an ML node since, by definition, such nodes will have $2Iv \leq T(d)$.

For any node v with rate $Rv > Rmin$, by distributing sufficient bits from the outer code into the subcode rooted at node v, the viable search space $Mv \leq T(d)$ at the node v in the Polar decoder 1214 may be reduced, thereby allowing these nodes having $Rv > Rmin$ to be decoding using ML as well.

Let Hv(p) denote the set of bits decoded prior to activating node v for each path p in the list of the best L paths, for $1 \leq p \leq L$. Let the number of previously decoded bits, which is the same for all paths in the list, be denoted by |Hv| If c outer-code bits are distributed into the Iv information bits encoded into the subcode corresponding to the node v, and these c outer-code bits are derived entirely and uniquely for each path p in the path list, from Hv(p) and the remaining Iv−c information bits corresponding to node v, then, since Hv(p) is already fully known for a given path p, the ML decoding needs to consider all $2^{Iv-c}$ possibilities for the Iv−c remaining information bits encoded into the subcode corresponding to node v. The ML search space per list element has thus been reduced from $2^{Iv}$ to $Mv = 2^{Iv-c}$, as there are only $2^{Iv-c}$ unique choices for the remaining non-redundant Iv−c information bits. Therefore, c, the number of outer-code bits distributed to any node v, need only be large enough such that $Mv = 2^{Iv-c} \leq T(d)$.

According to aspects, from the perspective of reducing the size of the ML search space for a given candidate ML node (e.g., any node v in the decoding tree for which a corresponding per-list-element search space size may be reduced to $Mv = 2^{Iv-c} \leq T(d)$), these c outer code bits can be distributed into any of the Iv bit indices corresponding to the given candidate ML node. However, in some cases, it may be beneficial to place the c outer-code bits into the c least reliable bit indices of the Iv bit indices corresponding to the candidate ML node, as even if there are some errors in the decoded c bits, the final decoded payload bits may still be correct.

According to aspects, due to only having a limited Louter total bits available in the outer code, there may not be enough outer code bits to ensure $Mv \leq T(d)$ at every node v in the decoding tree. Therefore, a main goal of the proposed algorithm is to find the optimal distribution C for the Louter outer-code bits to the various nodes v such that |Vd| is maximized at every degree d, starting from the root of the decoding tree.

FIG. 14 illustrates an example algorithm 1400 for determining how to distribute outer-code bits within the leaf nodes of a decoding tree, for example, to reduce the search space of certain nodes in a decoding tree, according to aspects of the present disclosure.

As illustrated, given the inputs N, T(d), and Louter, the algorithm begins (e.g., in lines 2 and 3) by initializing a variable 'x' to the number of Louter outer-code bits available for insertion/distribution and the variable 'd' to log 2(N). Next, at lines 5 and 6, beginning at degree $d = \log 2(N)$ (i.e., the root of the decoding tree), the algorithm sorts all nodes v at degree d to form a set of nodes, A, in order of increasing rate, Rv, and removes from set A any nodes v at degree d whose rate is equal to zero or one. According to aspects, the algorithm 1400 may remove nodes v whose rate is equal to zero or one since decoding these types of nodes is trivial (e.g., any rate-0 nodes always trivially decode to all zeros, while rate-1 nodes can also be rapidly decoded, at most with a very limited and simple search). Thus, there may be no need or desire to do ML decoding (or even SCL decoding) for nodes v whose rates are zero or one.

According to aspects, after removing rate-zero and rate-one nodes, in lines 7-11, the algorithm next removes from set A any nodes v that are part of any ML subtree, where an ML subtree is defined as a tree rooted at any node in Vk, for $d < k \leq \log 2(N)$. According to aspects, the algorithm removes any nodes v that are part of any ML subtree since a decoder should never traverse to, and therefore will not do ML at, any node whose ancestor is an ML node.

Next, in lines 12 and 13, the algorithm initializes Vd and Cd to φ, and in lines 15-17, for each node v that is an element of the set A, the algorithm adds any nodes v to Vd whose rate Rv is less than Rmin (e.g., where $R_{min}(d) = \log_2 T(d)/2^d$) since any node v with $0 < Rv \leq Rmin$ is already an ML node by definition. Thus, any node v with $0 < Rv \leq Rmin$ may be added to Vd and its corresponding entrie(s) in Cd is set to zero (i.e., none of the x remaining outer-code bits are distributed to any nodes v with $Rv \leq Rmin$).

Next, in line 19, for each node v that is an element of the set A and whose rate is greater than Rmin, the algorithm determines whether that node (e.g., a parent node) has a rate-one child node. According to aspects, if the parent node has a rate-one child, the parent node may not be added to Vk, as the decoder would generally be better off (lower latency) simply traversing down one more level (e.g., degree) in the decoding tree, and doing rate-one decoding at the rate-one child and ML decoding at the other child of the parent node.

Next, according to aspects, in lines 20-24, the algorithm considers each remaining ML candidate node v in set A in order of increasing Rv. According to aspects, assuming there that x outer-code bits remaining to distribute is greater than zero, and that distributing $c \leq x$ outer code bits to node v will result in $Mv \leq T(d)$, the algorithm adds node v to Vd and sets the element of Cd corresponding to node v to be equal to c (e.g., where c equals the number of outer-code bits distributed to node v such that $Mv \leq T(d)$. According to aspects, the algorithm, in line 22, decrements x, the number of outer-code bits remaining to distribute, by the c bits that have just been distributed to node v. According to aspects, once the algorithm hits a node v where a reduced search space of the node v cannot reach $Mv \leq T(d)$, even if all the remaining x outer code bits are distributed to node v, the algorithm proceeds to the next degree, d−1, and repeats until d=0.

Figure 15:
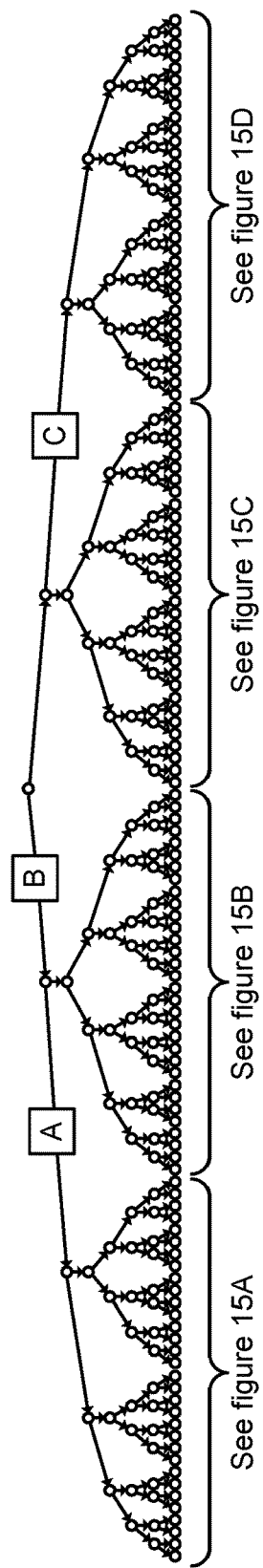
FIG. 15 illustrates an example decoding tree, in accordance with certain aspects of the present disclosure.
Figure 15A:
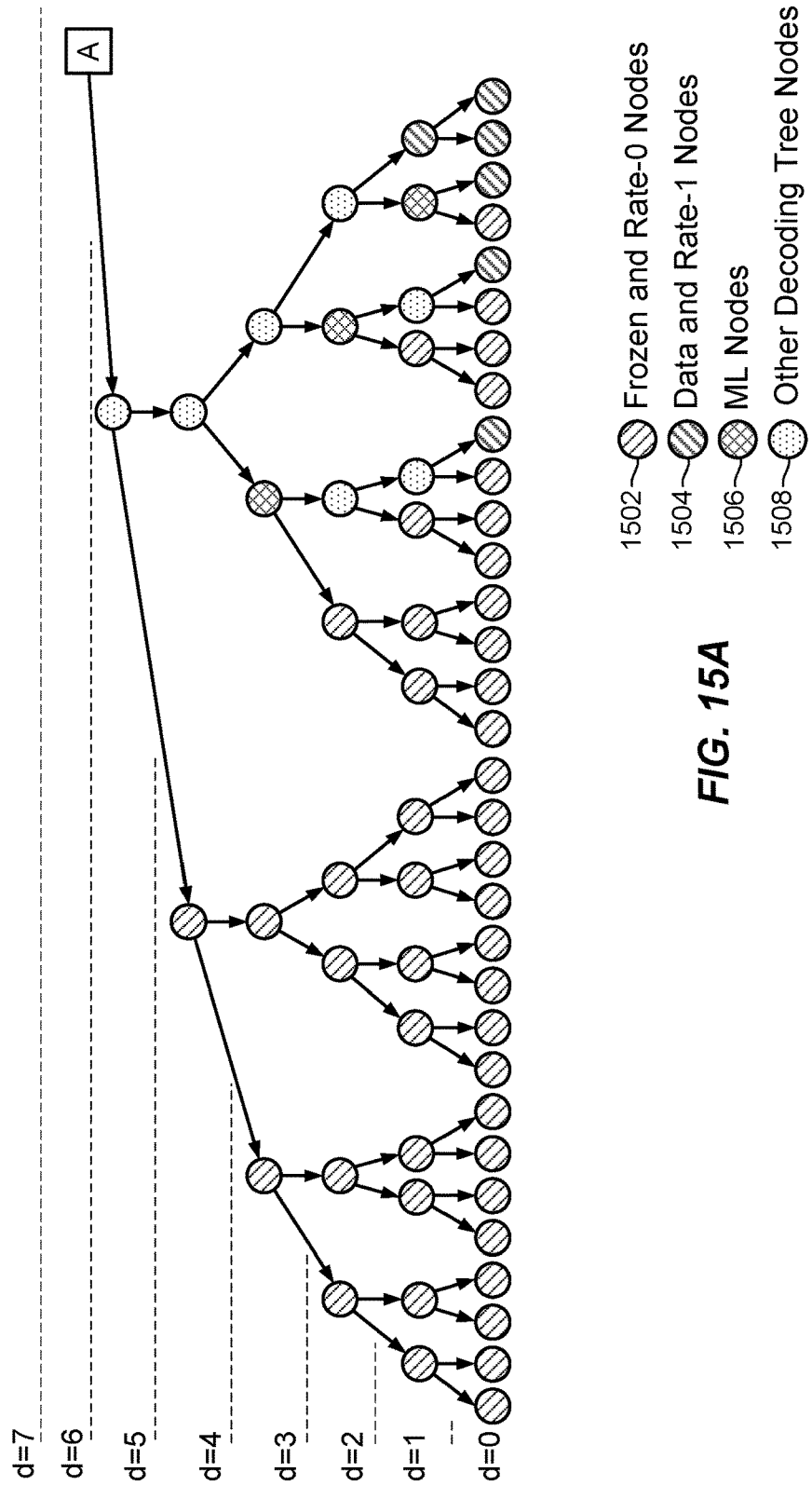
FIGS. 15A-15D illustrate the decoding tree in FIG. 15 that has been split up for ease of viewing, in accordance with certain aspects of the present disclosure.
Figure 15B:
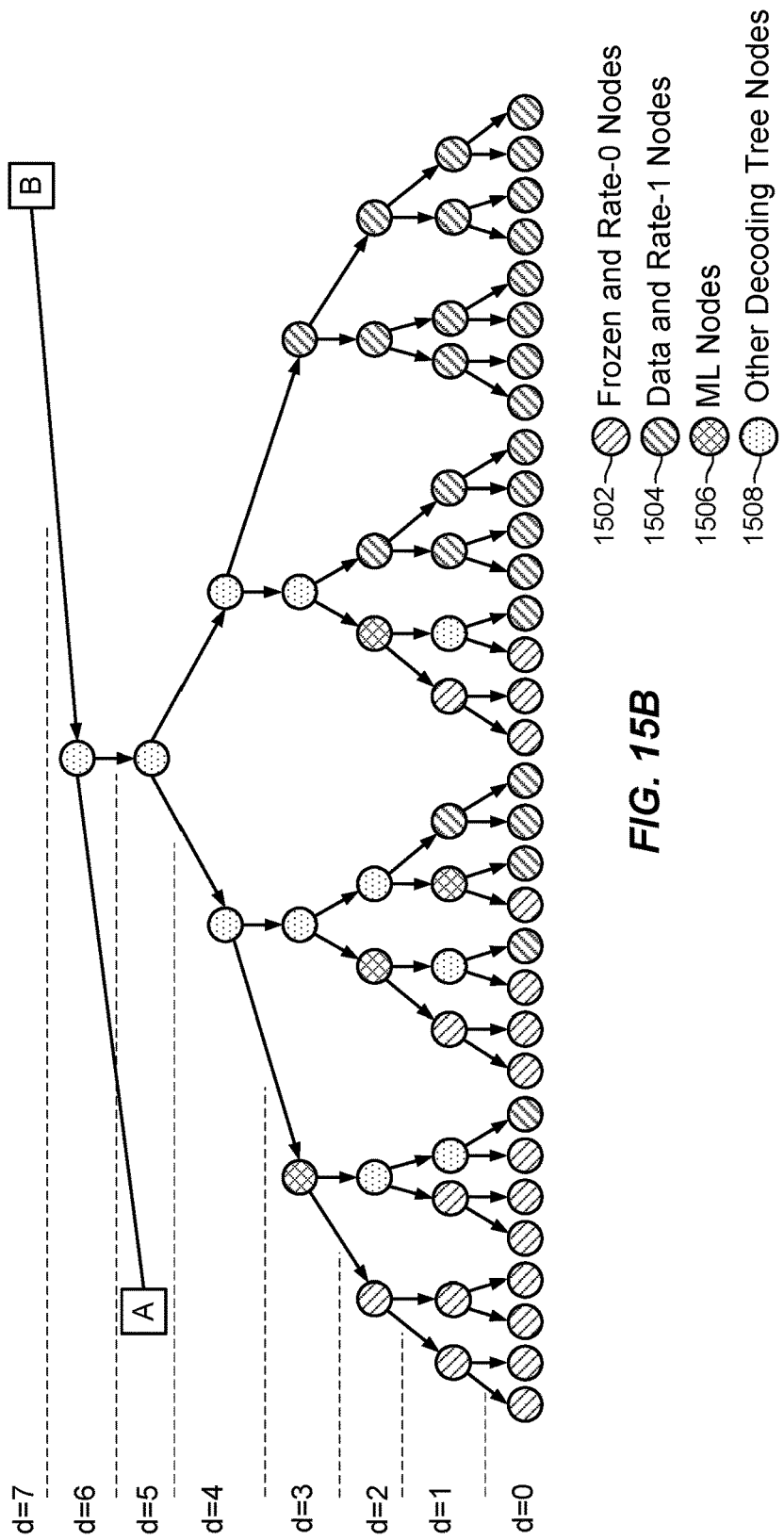
Figure 15C:
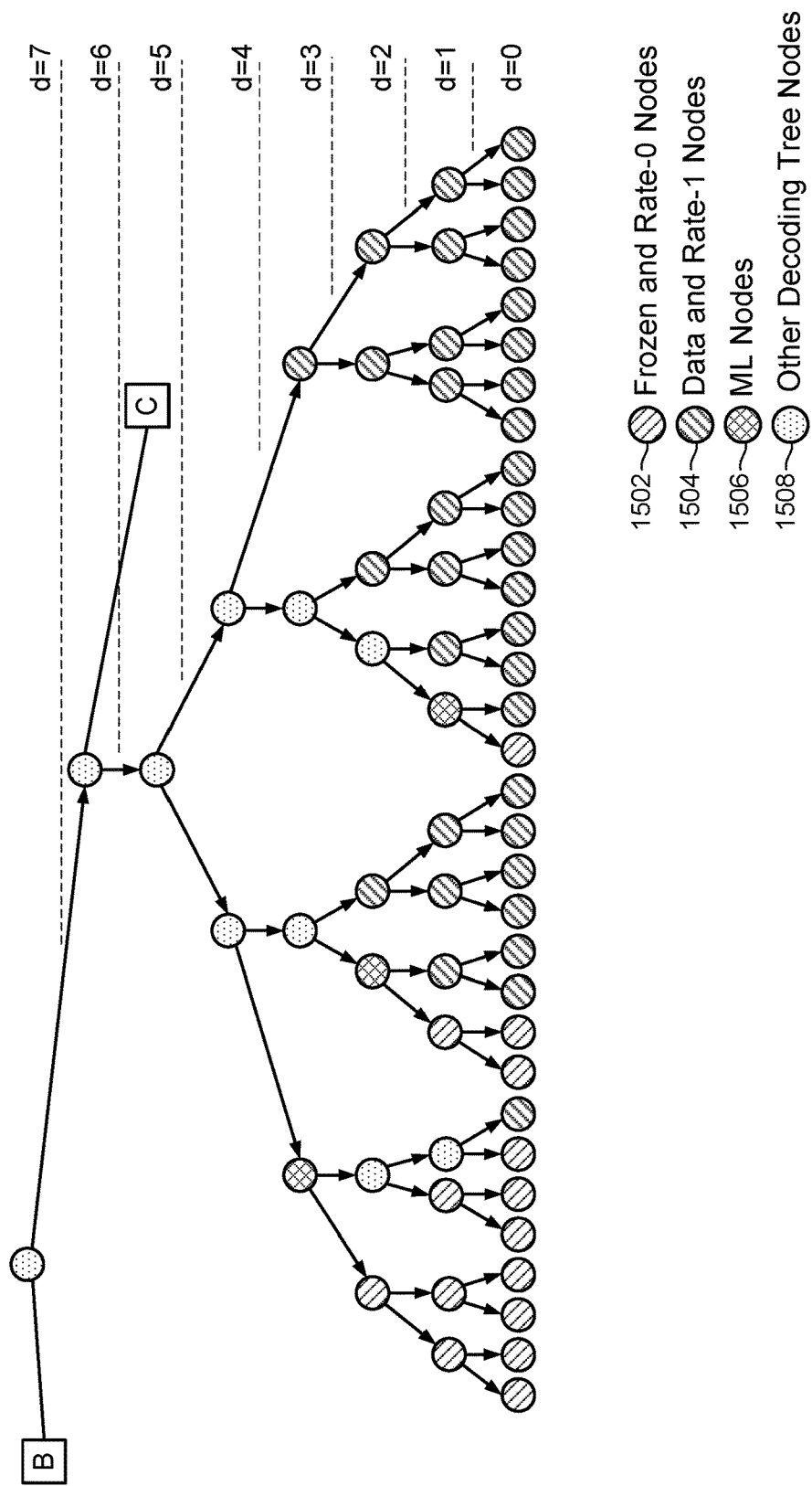
Figure 15D:
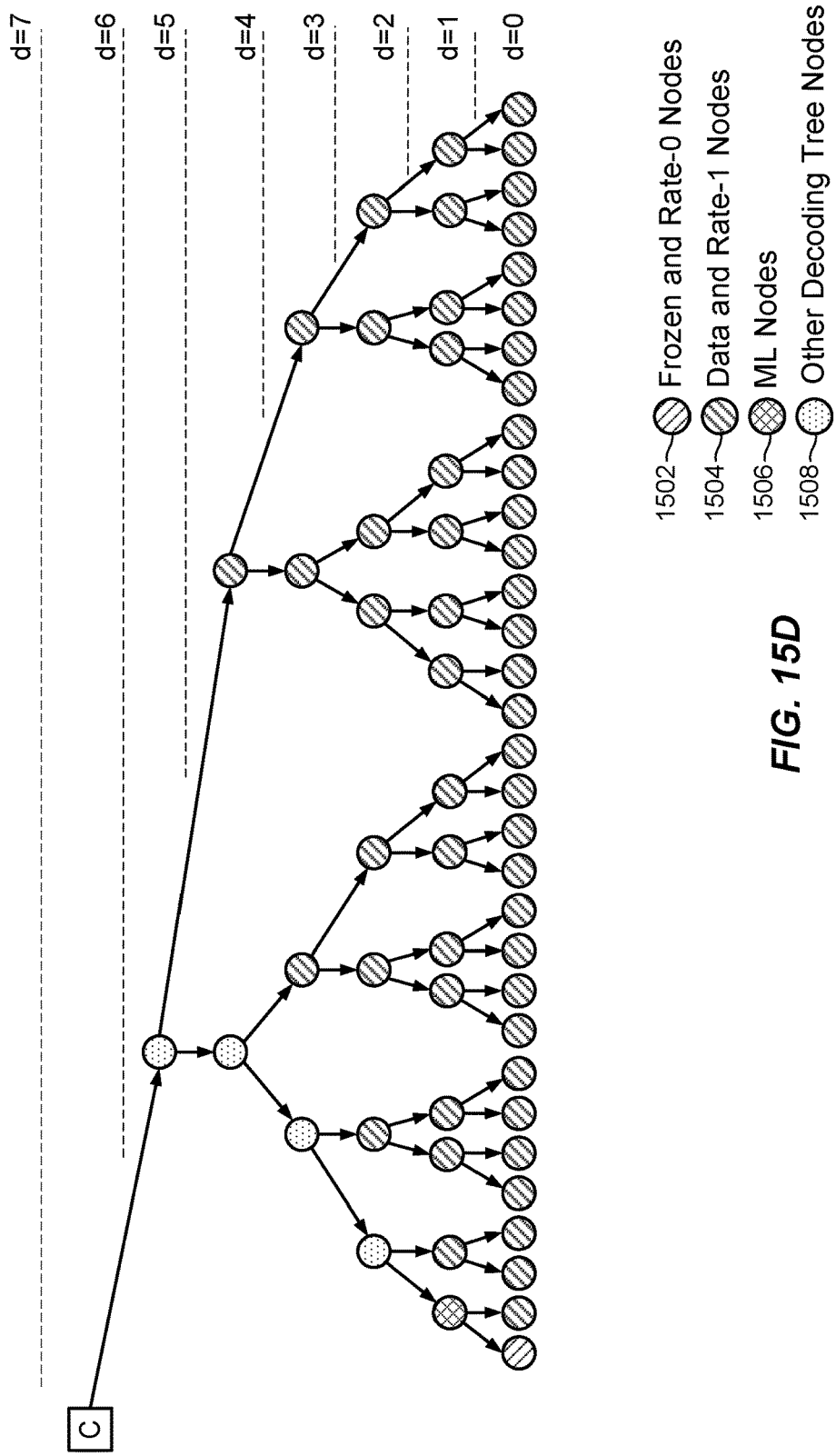
Figure 16:
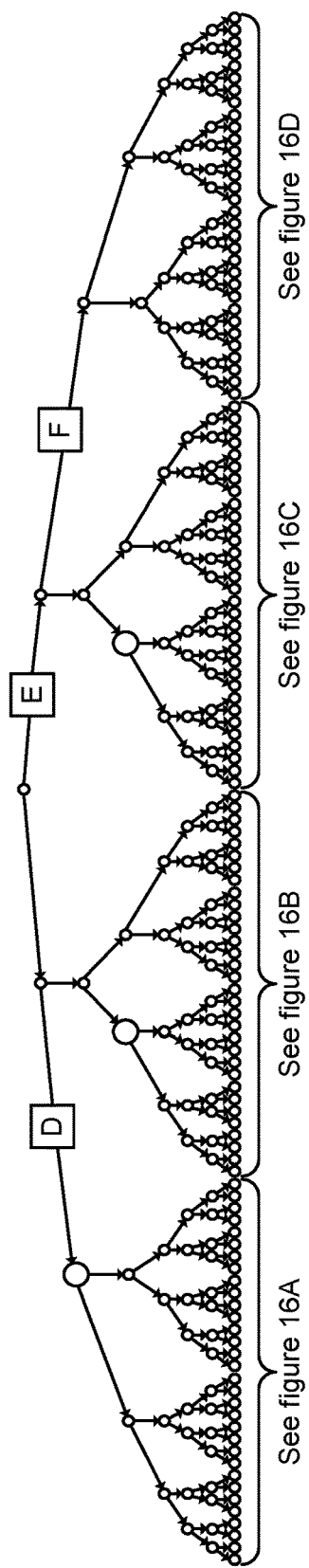
FIG. 16 illustrates an example decoding tree after applying an algorithm for reducing the ML decoding search space size of certain nodes in the decoding tree, in accordance with certain aspects of the present disclosure.

FIGS. 15-16 illustrate example decoding trees and a graphical representation of the result of applying algorithm 1400, according to aspects of the present disclosure. In FIGS. 15-16, the following input variable sizes (in bits) may be assumed: N=128, K'=60, K=76, and Louter=K−K'=16. Additionally, T(d) may be assumed to be 4 and constant with respect to d, though, in practice, T(d) may not necessarily be constant with respect to degree. Further, the decoding trees illustrated in FIGS. 15-16 are degree-7 (d=7) decoding trees, as indicated.

FIG. 15 illustrates a decoding tree before application of the algorithm 1400. It should be noted that the decoding tree illustrated in FIG. 15 has been split into four separate figures (e.g., FIGS. 15A-15D) for ease of viewing. The way in which FIGS. 15A-15D are assembled together (e.g., to represent the decoding tree in FIG. 16) is indicated in the figures. For example, as illustrated, FIG. 15A connects to FIG. 15B at connection A, FIG. 15B connects to FIG. 15C at connection B, etc.

As illustrated in FIGS. 15A-15D, nodes 1502 represent frozen and rate-zero nodes, nodes 1504 represent data and rate-one nodes, nodes 1506 represent ML nodes (e.g., where 2Iv=T(d)=4, or Iv=2), and nodes 1508 represent all other nodes in the decoding tree. According to aspects, in the example decoding tree illustrated in FIG. 15, a decoder may only perform ML decoding on a node (e.g., a parent node) when Iv≤2 According to aspects, if the decoder decodes a subcode rooted at any parent node at 1506 using ML decoding, the decoder will not traverse to any of the children nodes in the subtree rooted at that node at 1506, and may therefore not consider doing ML at any of the parent node's children.

Additionally, it should be noted that, with reference to FIGS. 15A-15D, there are a total of K (e.g., 76) leaf nodes (e.g., at d=0), corresponding to the 76 data nodes from the perspective of the polar encoder (or decoder). According to aspects, these 76 leaf nodes may include 16 redundant outer code bits and 60 payload bits. According to aspects, the algorithm 1400 may be configured to distribute those 16 redundant outer code bits to various nodes in the decoding tree such that a decoder may decode using ML at a higher degree in the decoding tree.

FIG. 16 illustrates the decoding tree 1500 after application of the algorithm 1400, according to certain aspects of the present disclosure. It should be noted that the decoding tree illustrated in FIG. 16 has been split into four separate figures (e.g., FIGS. 16A-16D) for ease of viewing. The way in which FIGS. 16A-16D are assembled together (e.g., to represent the decoding tree in FIG. 16) is indicated in the figures. For example, as illustrated, FIG. 16A connects to FIG. 16B at connection D, FIG. 16B connects to FIG. 16C at connection E, etc.

As illustrated, FIGS. 16A-16D include nodes 1602-1608, which may correspond to nodes 1502-1508 illustrated in FIGS. 15A-15D. Additionally, the decoding tree illustrated in FIGS. 16A-16D includes nodes 1610 and nodes 1612. According to aspects, nodes 1610 represent subcodes into which the indicated number of outer code bits have been distributed by application of the algorithm 1400. As illustrated, the number of outer-code bits distributed to each of these nodes is indicated inside the nodes 1610. By distributing the outer code bits shown into each of the nodes 1610, the application of algorithm 1400 reduces the size of the ML search space at each of the nodes in 1610 to be within the target threshold (e.g., T(d)), thus allowing the decoder to efficiently use ML decoding to decode the subcodes corresponding to nodes 1610.

Further, according to aspects, nodes 1612 represent an example of how the outer code bits might be distributed within subcode rooted at each node 1610. Further, according to aspects, nodes 1612 may always be considered as data nodes (i.e., not frozen bits) from the perspective of the polar encoder/decoder, but are redundant (e.g., fully dependent on the already decoded nodes 1604 and/or the remaining nodes 1604 in the subcode). Thus, the search space may be given by only considering the remaining number of nodes 1604 in each ML subcode, which can be seen to always be less than or equal to 2, for example, as forced by the setting of the threshold T(d). According to aspects, FIG. 16 illustrates these nodes 1612 as replacing the leftmost nodes 1504 of FIG. 15 in each subcode. However, it should be understood that algorithm 1400 allows these nodes 1612 to replace any of the nodes 1504 of FIG. 15 within the subcode with no loss of generality.

Comparing the decoding trees illustrated in FIGS. 15A-15D and 16A-16D (e.g., before and after application of the algorithm 1400), it can be seen that by suitably distributing outer code bits in the encoder according to algorithm 1400, the decoding tree illustrated in FIGS. 16A-16D now has ML nodes with reduced search space size that are higher up the decoding tree, for example, in the locations of nodes 1610. For example, as illustrated, the algorithm 1400 has created an ML node 1610 in the decoding tree at degree=5, index (from left, assuming the root of the decoding tree is at the top)=0, by distributing 3 outer-code bits to this node to reduce the search space size from 25 to 22. Additionally, as illustrated, the algorithm 1400 has created an ML node 1610 in the decoding tree at degree=4, index (from left)=2, by distributing 3 outer-code bits to this node to reduce the search space size from 25 to 22. Additionally, the algorithm 1400 has created an ML node 1610 in the decoding tree at degree=4, index (from left)=4, by distributing 5 outer-code bits to this node to reduce the search space size from 27 to 22.

In some cases, instead of distributing all of the outer-code bits, only a subset of outer-code bits may be distributed. For example, in some cases, distributing outer-code bits into ML nodes in the fashion described above may not be desirable as some of the outer code bits are used, for example, after decoding, to select a path from a final list of paths and to reduce the rate of false passes (e.g., in cases where the outer code passes but information bits are still in error). Thus, in some cases, x in the above algorithm 1400 may be initialized on line 2 to some value less than the total number of outer code bits (e.g., Louter), so that only a subset of the outer code bits are distributed as described above. Thus, according to aspects, the remaining outer-code bits not distributed into ML nodes may be used, for example, by a decoder for selecting a path from a final list of paths and for reducing the rate of false passes.

Additionally, according to certain aspects, the algorithm 1400 may be extended to frozen bits. For example, algorithm 1400 described above optimally allocates outer-code bits to reduce the size of the ML search spaces. However, it is also possible to allocate some of the frozen bits to reduce the ML search space in an analogous manner. For example, in general, frozen bits may be allocated to the N−K least reliable bit channels of the Polar encoder, which provides optimal error-rate performance. Nevertheless, it may be possible to essentially exchange some data bits with frozen bits using a greedy algorithm analogous to that described above. In particular, given a node v having Iv near the threshold T(d), frozen bits outside node v with relatively high reliabilities can be exchanged with the least reliable data bits inside node v, such that Iv≤T(d). However, this exchanging of data bits with frozen bits may only be beneficial as long as the resulting degradation in error-rate performance during decoding remains negligible. Alternatively, data bits in Iv may be replaced by new frozen bits (e.g., instead of being exchanged with existing frozen bits), which would reduce the rate rather than the performance. In either case, algorithm 1400 may be configured to distribute frozen bits in the same manner as outer-code bits, except that x may be replaced by xf, indicating the number of frozen bits left to distribute, and xf may be initialized to the total number of frozen bits initially available to distribute.

According to aspects, as noted above, one or more frozen bits may be distributed into ML nodes to reduce the size of the search space of a node in the decoding tree. However, since frozen bits are typically allocated to the least reliable N−K channels, distributing frozen bits into ML nodes may degrade error-rate performance. However, for the purposes of rate-matching, and in particular puncturing and shortening, frozen bits may sometimes be allocated to more reliable bit indices. These frozen bits can therefore be distributed into ML nodes, and exchanged for data bits, with reduced performance degradation or, in some cases, no (or little) performance degradation, in the event that the data bits are moved to more reliable locations.

According to aspects, in the algorithm 1400 described above, it was assumed to be possible to do ML at any degree d. In practice, an efficient decoder architecture may traverse m stages in the tree per clock cycle, where m≥1. Thus, for such an architecture, algorithm 1400 may be slightly modified to only consider distributing outer code (or frozen, punctured, or shortened) bits to nodes v in the decoding tree where the decoder could conceivably do ML. In other words, the algorithm 1400 may only consider nodes v having degree d where log 2(N)−d is an integer multiple of m. In such a case, in line 31 of algorithm 1400, d may be decremented by m instead of 1.

According to aspects, in algorithm 1400 described above, it was assumed to be possible to do ML at any degree d. In general, computing node metrics for each of the MvL search candidates at a given ML node v having degree d requires MvL parallel additions of 2d LLRs, so there may likely be a maximum degree (e.g., dmax<log 2(N)), above which doing ML would be cost prohibitive (e.g., regarding latency/resources at the decoder). To account for such a constraint, line 3 of algorithm 1400 may be modified to initialize d to dmax rather than log 2(N).

According to certain aspects, algorithm 1400 describes how to optimally determine the number of outer code bits to distribute to each ML node v, but it does not describe the choice of outer-code, nor the placement of those outer code bits within the ML node v. In general, algorithm 1400 may work with any choice of outer-code and any placement of the c bits inside each ML node, as long as the c redundant bits are derived entirely and uniquely, for each path p in the path list, from the already decoded bits Hv(p) and/or the remaining Iv−c information bits corresponding to v, as described above. Since exchanging or replacing c of the Iv data nodes with frozen (or punctured or shortened) bits would reduce the search space in an identical manner, these techniques are essentially equivalent from the perspective of the reduction of the ML search size complexity. Note, however, that if a particular decoder design chooses not to do ML or reduced ML at any particular node v, the c outer code bits distributed to the node v can instead be used for early termination or path selection, which would not be possible if those c bits were frozen. In some cases, to obtain the maximum benefit from this sort of flexibility, it may be beneficial to design the outer code to have good properties (e.g., such as minimum distance, decoding efficiency, etc.) when used for early termination and path selection instead of for reducing the ML search space size.

According to aspects, based on the techniques described above with respect to placement of the outer-code bits/frozen bits, it may be inferred that for outer-code bits distributed to nodes v that are activated relatively early during the decoding process at the decoder, so that |Hv|<<K, there may be relatively little value to using outer code bits as opposed to frozen bits, as almost no valuable information is contained in those outer bits anyway. Thus, in some cases, algorithm 1400 may set some constant threshold, H, for determining where to distribute frozen bits versus outer-code bits. For example, H may be set to H<<K such that if |Hv|≤H, c frozen bits are distributed to the least reliable bit indices in v, as described above, whereas if |Hv|>H, c outer code bits are distributed.

Figure 16A:
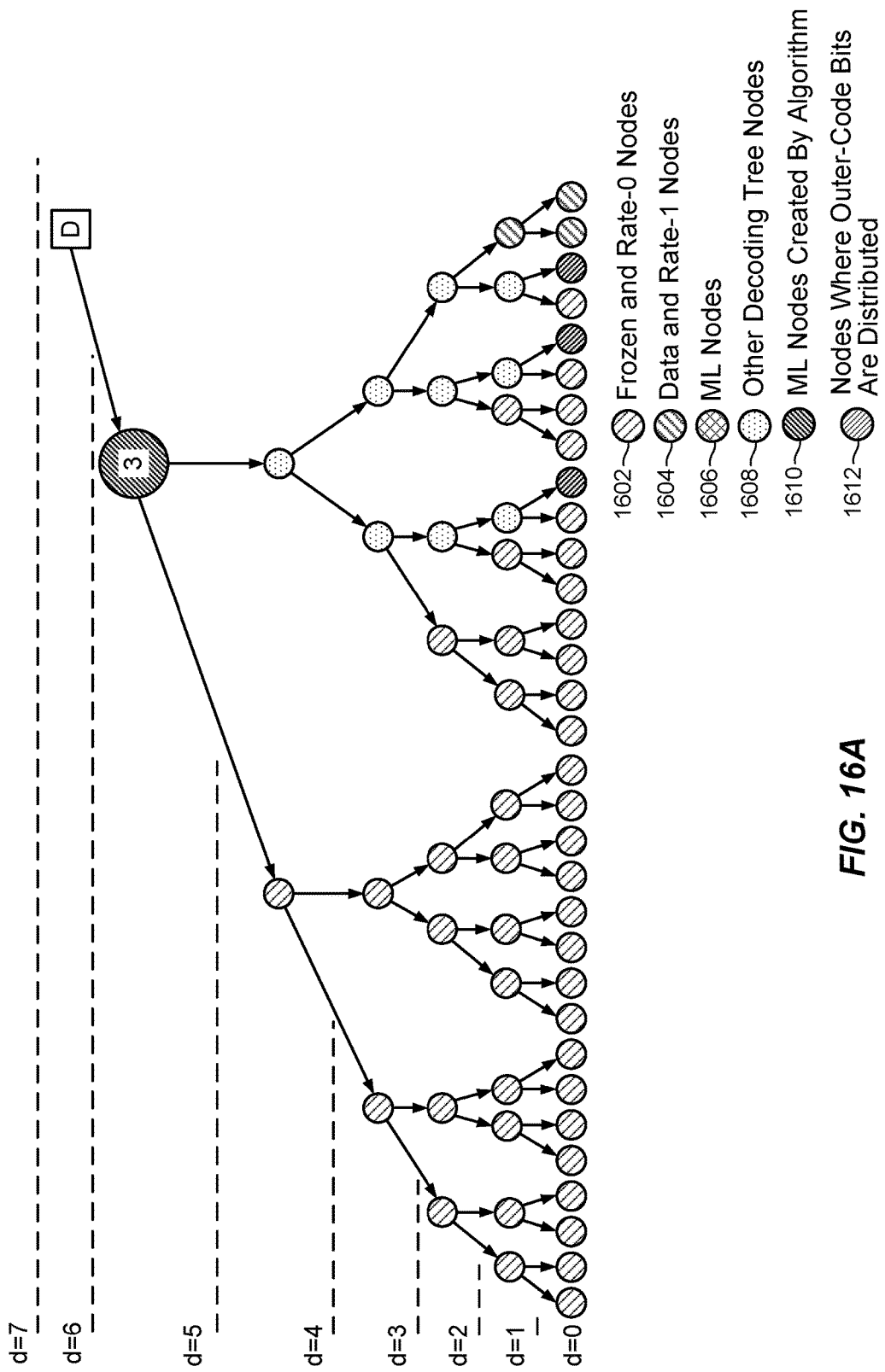
FIGS. 16A-16D illustrate the decoding tree in FIG. 16 that has been split up for ease of viewing, in accordance with certain aspects of the present disclosure.
Figure 16B:
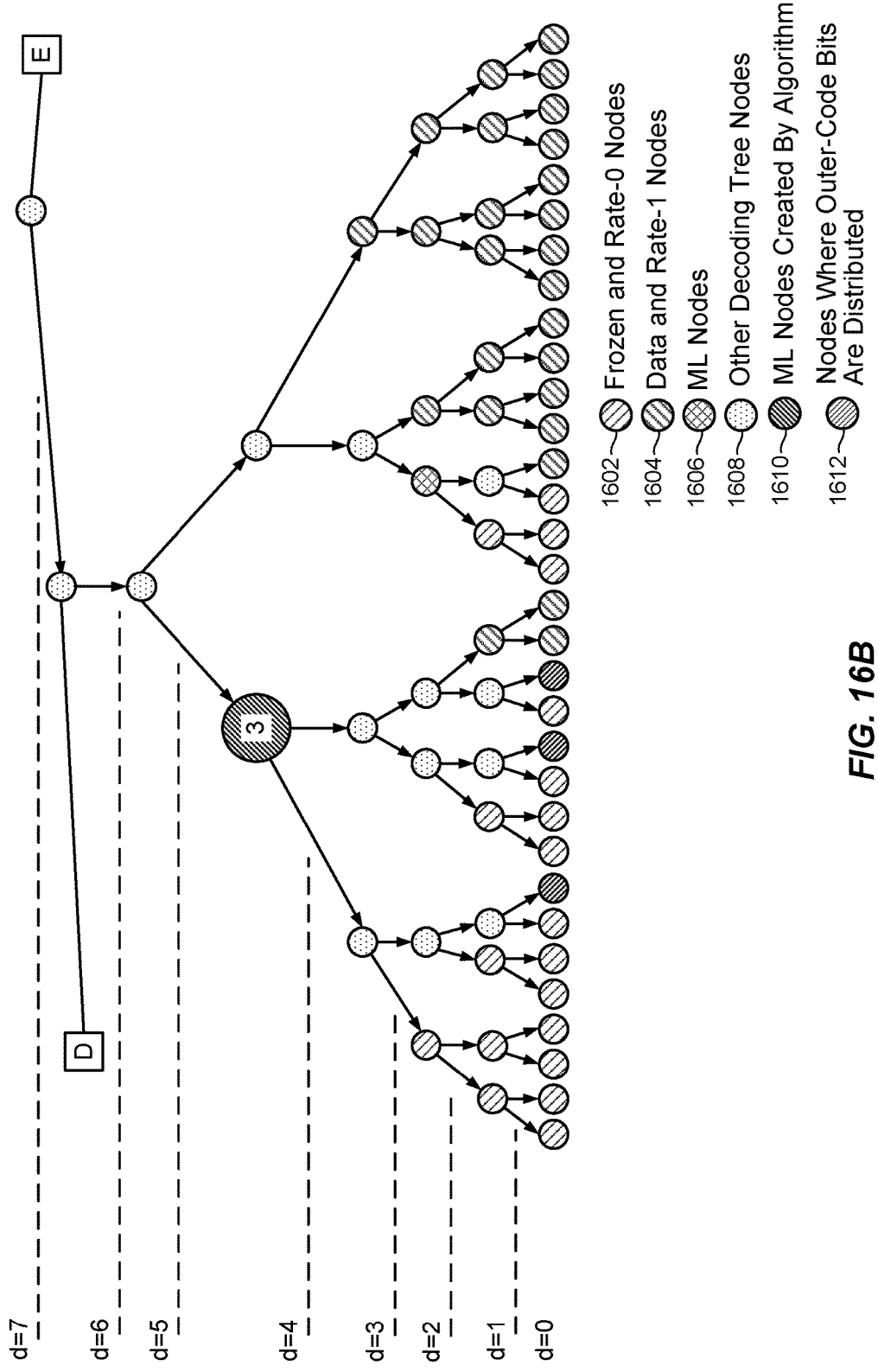
Figure 16C:
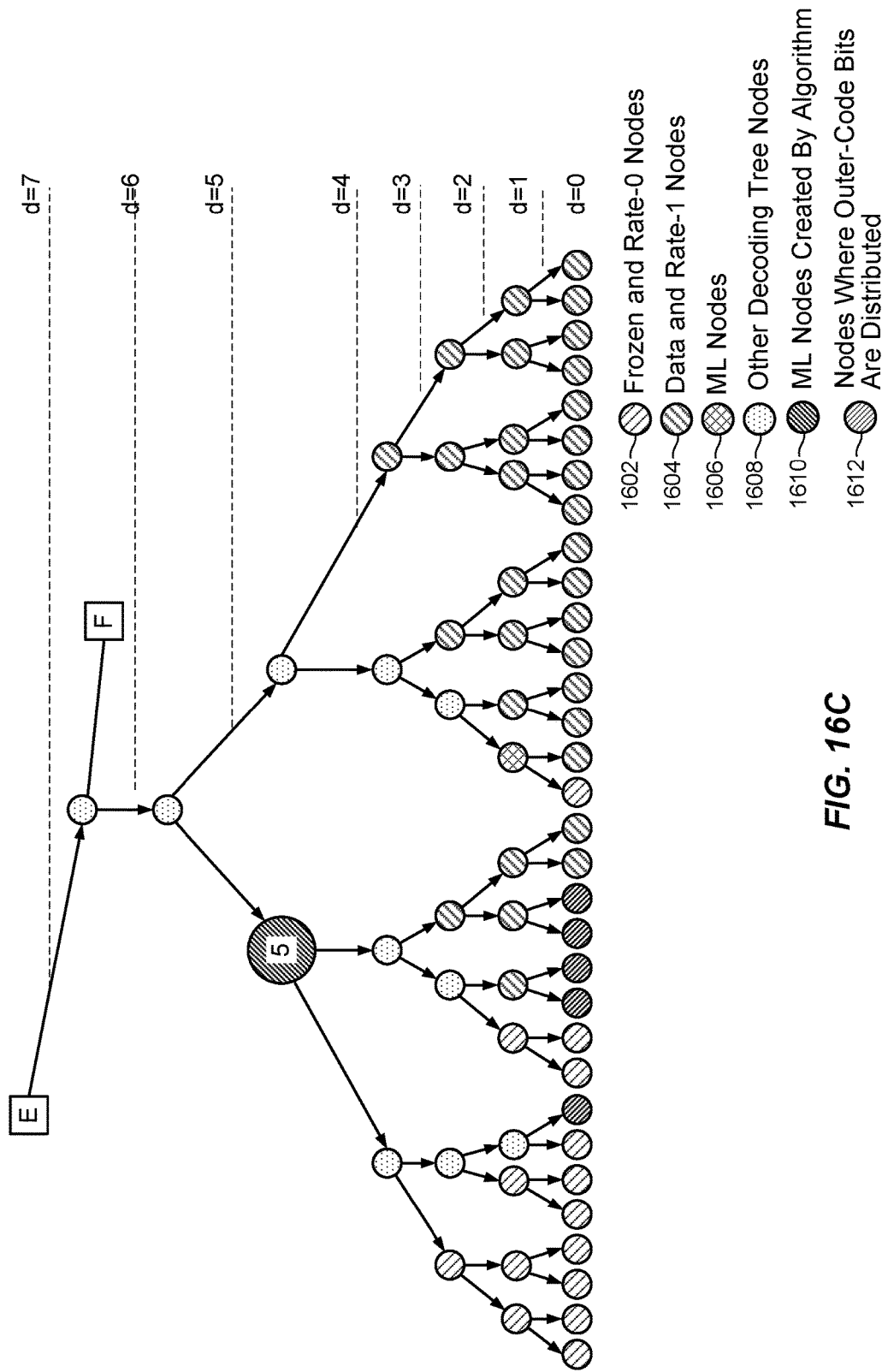
Figure 16D:
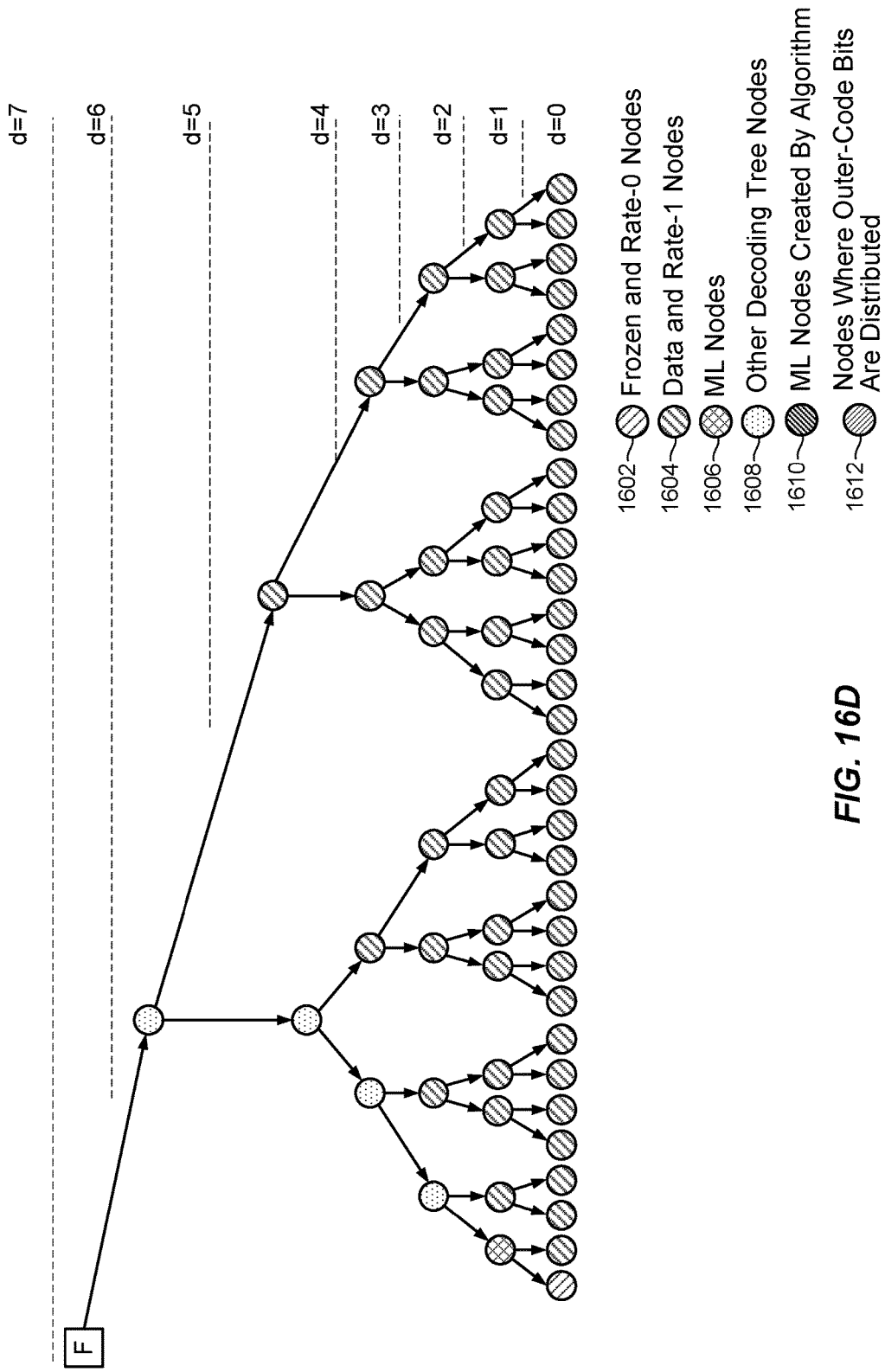

For example, assume that H is set to 10 (bits). With reference to FIG. 16, since 10 bits will not have been decoded after traversing to the first two ML nodes 1610 (e.g., nodes 1620 at d=5, index=0 in FIG. 16A and d=4, index=3 in FIG. 16B), the algorithm 1400 may distribute frozen bits into these nodes. Further, as the algorithm 1400 traverses to the last ML node 1610 (e.g., d=4, index=5 in FIG. 16C), a decoder (e.g., decoding the codeword) will have already decoded Hv=23 bits (including both nodes 1604 and 1612) or Hv=17 bits if only nodes 1604 are included (e.g., since the nodes 1612 in FIGS. 16A and 16B are frozen). Either way, Hv>10, so the algorithm 1400 may be configured to distribute outer-code bits to the internal ML node 1610 at d=4, index=5 in FIG. 16C.

Accordingly, algorithm 1400 may then be configured to separately track both xf, the number of remaining available frozen bits left to distribute to ML nodes, as well as x, the number of remaining available outer code bits left to distribute to ML nodes. According to aspects, the values of x and $x_f$ may be independent of each other, and x and $x_f$ need not be initialized to the same value.

It should be noted that the terms distributed, inserted, interleaved may be used interchangeably and generally refer to the strategic placement of outer-code bits within an information stream inputted into an encoder, such as a Polar encoder. Additionally, it should be understood that, while aspects of the present disclosure propose techniques for reducing the search space of nodes in a polar decoding tree with relation to wireless communication system, the techniques presented herein are not limited to such wireless communication system. For example, the techniques presented herein may equally apply to any other system that uses encoding schemes, such as data storage or compression, or fiber communication systems, hard-wire "copper" communication systems, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission.

Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting, means for receiving, means for determining, means for performing (e.g., rate-matching), means for encoding, means for generating, means for obtaining, means for forming, means for assigning, means for including, means for excluding, means for considering, means for exchanging, and/or means for decoding may comprise one or more processors or antennas at the BS 110 or UE 120, such as the transmit processor 420, controller/processor 440, receive processor 438, or antennas 434 at the BS 110 and/or the transmit processor 464, controller/processor 480, receive processor 458, or antennas 452 at the UE 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user equipment 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-Ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method of encoding bits of information, comprising:
obtaining a payload to be transmitted;
determining, in a polar decoding tree associated with a code size and a coding rate, a set of internal nodes to distribute one or more non-payload bits to based, at least in part, on a target maximum likelihood (ML) search space size for internal nodes in the polar decoding tree, a search space size of each of the internal nodes in the set of internal nodes, and an available number of the non-payload bits left to distribute;
forming an information stream by interleaving at least one or more of the non-payload bits with bits of the payload, wherein interleaving comprises, for each internal node in the set of internal nodes, assigning one or more non-payload bits to one or more leaf nodes in a subtree rooted at that internal node in the set of internal nodes; and
generating a codeword by encoding the information stream using a Polar code.

2. The method of claim 1, wherein the one or more non-payload bits reduce the search space size of each of the internal nodes in the set of internal nodes to which the one or more non-payload bits are assigned, and wherein reducing the search space size of each of the internal nodes in the set of internal nodes decreases latency of decoding the codeword.

3. The method of claim 1, wherein the target ML search space size indicates a threshold at or below which ML decoding can be performed on nodes in the polar decoding tree at a decoder.

4. The method of claim 1, wherein the one or more non-payload bits comprise at least one of frozen bits, punctured bits, shortened bits, or outer-code bits, wherein outer-code bits comprise one of cyclic redundancy check (CRC) bits, low-density parity check (LDPC) bits, or parity bits.

5. The method of claim 4, wherein the one or more non-payload bits comprise outer-code bits, and wherein the outer-code bits assigned to the one or more leaf nodes rooted at a first internal node are derived entirely and uniquely from at least one of:
bits that would be decoded before a decoder reaches the first internal node and a remaining number of payload bits in a subcode corresponding to the first internal node.

6. The method of claim 4, wherein the one or more non-payload bits comprise outer-code bits and only a subset of a total number of outer-code bits are assigned.

7. The method of claim 4 wherein:
the one or more non-payload bits comprise both frozen and outer-code bits; and
wherein assigning comprises:
assigning frozen bits to internal nodes in the set of internal nodes whose subcodes are decoded before a threshold number of payload bits will have been decoded in a decoder; and
assigning outer-code bits to internal nodes whose subcodes are decoded after the threshold number of payload bits.

8. The method of claim 1, further comprising:
including, in the set of internal nodes, internal nodes of the polar decoding tree whose code rate is greater than zero but less than one; and
excluding, from the set of internal nodes, any internal nodes in the polar decoding tree whose code rate is zero or one.

9. The method of claim 8, further comprising excluding, from the set of internal nodes, any internal nodes in the polar decoding tree having a rate-one child node.

10. The method of claim 1, further comprising:
excluding, from the set of internal nodes, any internal node in the polar decoding tree that is rooted at a parent node with a search space size at or below the target ML search space size; and
excluding, from the set of internal nodes, any internal node in the polar decoding tree that is rooted at a parent node that is already included in the set of internal nodes.

11. The method of claim 1, further comprising:
considering internal nodes of the polar decoding tree for inclusion in the set of internal nodes starting from a root of the polar decoding tree, and proceeding down the polar decoding tree, m levels at a time, where m is an integer greater than or equal to 1;
at each level in the polar decoding tree, sorting the internal nodes in order of increasing effective code rate or increasing number of information bits;
including, in the set of internal nodes, an internal node whose search space size can be reduced to the target ML search space size by assigning one or more of the available number non-payload bits to this internal node; and
excluding, from the set of internal nodes, an internal node whose search space size cannot be reduced to the target ML search space size even if all of the available number non-payload bits are assigned to this internal node.

12. The method of claim 1, wherein assigning the one or more non-payload bits to the internal nodes in the set of internal nodes comprises:
assigning the one or more non-payload bits to bit indices, in the information stream, corresponding to the one or more leaf nodes of subtrees rooted at the internal nodes in the set of internal nodes.

13. The method of claim 12, wherein:
the polar decoding tree comprises a plurality of degrees corresponding to levels in the polar decoding tree;
a child node comprises a node having a degree one less than a corresponding parent node; and
leaf nodes comprise degree-zero nodes in the polar decoding tree and the internal nodes are node with a degree greater than zero in the polar decoding tree.

14. The method of claim 12, wherein the bit indices to which non-payload bits are assigned, correspond to the leaf nodes with the lowest reliabilities in a subtree rooted at that internal node.

15. The method of claim 1, further comprising determining how many non-payload bits to assign to a first internal node in the set of internal nodes based, at least in part, on the target ML search space size, a search space size of the first internal node, and the available number of the non-payload bits left to assign.

16. The method of claim 15, wherein:
assigning one or more non-payload bits to the first internal node reduces the size of the search space of the internal node; and
determining how many non-payload bits to assign to the first internal node is based further on a comparison of how many non-payload bits are needed to reduce the size of the search space of the first internal node to the target ML search space size.

17. The method of claim 1, wherein:
the one or more non-payload bits comprise frozen bits; and
assigning the one or more non-payload bits to the internal nodes in the set of internal nodes comprises:
exchanging information bits associated with the internal nodes in the set of internal nodes with frozen bits.

18. The method of claim 1, wherein:
the one or more non-payload bits comprise additional frozen bits added to the information stream instead of information bits to reduce a coding rate of the codeword; and
assigning the one or more non-payload bits to the internal nodes in the set of internal nodes comprises replacing information bits associated with the internal nodes in the set of internal nodes with frozen bits.

19. The method of claim 1, further comprising:
performing rate-matching on the information stream by adding frozen bits to the information stream, wherein assigning the one or more non-payload bits to the internal nodes in the set of internal nodes comprises assigning the added frozen bits to the internal nodes in the set of internal nodes.

20. The method of claim 1 wherein the one or more non-payload bits are only assigned to internal nodes having degree d less than some maximum degree $d_{max}$.

21. A method of decoding bits of information, comprising:
receiving a codeword;
determining, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes; and
decoding the codeword at least by performing ML decoding on the internal nodes in the set of internal nodes.

22. The method of claim 21, wherein the one or more non-payload bits reduce the search space size of each of the internal nodes in the set of internal nodes to which the one or more non-payload bits are distributed, and wherein reducing the search space size of each of the internal nodes in the set of internal nodes decreases latency of decoding the codeword.

23. The method of claim 21, wherein the target ML search space size indicates a threshold at or below which ML decoding can be performed on nodes in the polar decoding tree at a decoder.

24. The method of claim 21, wherein the one or more non-payload bits comprise at least one of frozen bits, punctured bits, shortened bits, or outer-code bits, wherein outer-code bits comprise one of cyclic redundancy check (CRC) bits, low-density parity check (LDPC) bits, or parity bits.

25. The method of claim 24, wherein the one or more non-payload bits comprise outer-code bits, and wherein the outer-code bits assigned to the one or more leaf nodes rooted at a first internal node are derived entirely and uniquely from at least one of:
bits that would be decoded before a decoder reaches the first internal node and a remaining number of payload bits in a subcode corresponding to the first internal node.

26. The method of claim 24 wherein:
the one or more non-payload bits comprise both frozen and outer-code bits;
frozen bits are distributed to internal nodes in the set of internal nodes whose subcodes are decoded before a threshold number of payload bits will have been decoded in a decoder; and
outer-code bits are assigned to internal nodes whose subcodes are decoded after the threshold number of payload bits.

27. An apparatus for encoding bits of information, comprising:
at least one processor configured to:
obtain a payload to be transmitted;
determine, in a polar decoding tree associated with a code size and a coding rate, a set of internal nodes to distribute one or more non-payload bits to based, at least in part, on a target maximum likelihood (ML) search space size for internal nodes in the polar decoding tree, a search space size of each of the internal nodes in the set of internal nodes, and an available number of the non-payload bits left to distribute;
form an information stream by interleaving at least one or more of the non-payload bits with bits of the payload, wherein interleaving comprises, for each internal node in the set of internal nodes, assigning one or more non-payload bits to one or more leaf nodes in a subtree rooted at that internal node in the set of internal nodes; and
generate a codeword by encoding the information stream using a Polar code; and
a memory coupled with the at least one processor.

28. The apparatus of claim 27, wherein the at least one processor is configured to:
include, in the set of internal nodes, internal nodes of the polar decoding tree whose code rate is greater than zero but less than one; and
exclude, from the set of internal nodes:
any internal nodes in the polar decoding tree whose code rate is zero or one;
any internal nodes in the polar decoding tree having a rate-one child node;

any internal node in the polar decoding tree that is rooted at a parent node with a search space size at or below the target ML search space size; and any internal node in the polar decoding tree that is rooted at a parent node that is already included in the set of internal nodes.

29. An apparatus for decoding bits of information, comprising:
at least one processor configured to:
receive a codeword;
determine, in a polar decoding tree associated with a code size and a coding rate, a set of internal nodes where one or more non-payload bits are distributed, wherein a distribution of the non-payload bits is based, at least in part, on a target maximum likelihood (ML) search space size for internal nodes in the polar decoding tree, a search space size of each of the internal nodes in the set of internal nodes; and
decode the codeword at least by performing ML decoding on the internal nodes in the set of internal nodes; and
a memory coupled with the at least one processor.

30. The apparatus of claim 29, wherein the one or more non-payload bits reduce search space size of each of the internal nodes in the set of internal nodes to which the one or more non-payload bits are distributed, and wherein reducing the search space size of each of the internal nodes in the set of internal nodes decreases latency of decoding the codeword.

* * * * *